(12) United States Patent
Mercaldi-Kim et al.

(10) Patent No.: US 7,598,766 B2
(45) Date of Patent: Oct. 6, 2009

(54) CUSTOMIZED SILICON CHIPS PRODUCED USING DYNAMICALLY CONFIGURABLE POLYMORPHIC NETWORK

(75) Inventors: Martha Mercaldi-Kim, Seattle, WA (US); Mark Oskin, Seattle, WA (US); John Davis, San Francisco, CA (US); Todd Austin, Ann Arbor, MI (US); Mojtaba Mehrara, Ann Arbor, MI (US)

(73) Assignees: University of Washington, Seattle, WA (US); Microsoft Corporation, Redmond, WA (US); Regents of the U of Michigan, Ann Arbor, MI (US)

( * ) Notice: Subject to any disclaimer, the term of this patent is extended or adjusted under 35 U.S.C. 154(b) by 0 days.

(21) Appl. No.: 11/971,349

(22) Filed: Jan. 9, 2008

(65) Prior Publication Data

US 2008/0164907 A1    Jul. 10, 2008

Related U.S. Application Data

(60) Provisional application No. 60/884,081, filed on Jan. 9, 2007.

(51) Int. Cl.
   *H03K 19/173* (2006.01)
(52) U.S. Cl. .......................................... 326/28; 326/41
(58) Field of Classification Search .............. 326/37–41
See application file for complete search history.

(56) References Cited

U.S. PATENT DOCUMENTS 7,068,072 B2 * 6/2006 New et al. ..................... 326/47

7,268,586 B1 * 9/2007 Redgrave ...................... 326/41

OTHER PUBLICATIONS

Perkins, James Michael. "Magnetically Assisted Statistical Assembly of III-V Heterostructures on Silicon: Initial Process and Technology Development" Department of Electrical Engineering and Computer Science, Massachusetts Institute of Technology, Copyright May 2002.

Rumpler II, Joseph John. "Optoelectronic Integration Using the Magnetically Assisted Statistical Assembly Technique: Initial Magnetic Characterization and Process Development" Department of Electrical Engineering and Computer Science, Massachusetts Institute of Technology, Copyright Sep. 2002.

Abad, Pablo, Valentin Puente, Pablo Prieto, and Jose Angel Gregorio. "Rotary Router: An Efficient Architecture for CMP Interconnection Networks" University of Catabria, Spain. Copyright 2007 ACM978-1-59593-706-3/07/0006. pp. 116-125.

(Continued)

*Primary Examiner*—Don P Le
(74) *Attorney, Agent, or Firm*—Ronald M. Anderson

(57) ABSTRACT

A fabrication technique called "component and polymorphic network," in which semiconductor chips are made from small prefabricated bare electronic component dies, e.g., application specific integrated circuits (ASICs), that are assembled according to designer specifications, and bonded to a semiconductor substrate comprising the polymorphic network. The component and polymorphic network assembly has a low overhead for producing custom chips. In another exemplary embodiment, the polymorphic network can be combined with functional components in a single die. The interconnect scheme for ports on the polymorphic network can be configured or reconfigured with configuration data prior to the runtime of an application, to achieve different interconnect schemes.

28 Claims, 14 Drawing Sheets

OTHER PUBLICATIONS

Abnous, A., H. Zhang, M. Wan, V. George, V. Prabhu, J. Rabaey. "The Pleiades Architecture," in the Application of Programmable DSPs in Mobile Communications, A. Gatherer and A. Auslander, Ed., Wiley, 2002, pp. 327-360.

Balfour, James, and William J. Dally. "Design Tradeoffs for Tiled CMP On-Chip Networks," Computer Systems Laboratory, Stanford University. Copyright 2006 ACM 1-59593-282-08/06/0006.

Barber, Alan, Ken Lee, and Hanns Obermaier. "A Bare-chip Probe for High I/O, High Speed Testing" Copyright 1994 Hewlett-Packard Company. HPL-94-18. Mar. 1994.

Constantinides, Kypros, Stephen Plaza, Jason Blome, Bin Zhang, Valeria Bertacco, Scott Mahlke, Todd Austin, Michael Orshansky. "BulletProof: A Defect-Tolerant CMP Switch Architecture" Advanced Computer Architecture Lab, University of Michigan and Department of Electrical and Computer Engineering, University of Texas at Austin.

Coppola, Marcello, Riccardo Locatelli, Giuseppe Maruccia, Lorenzo Pieralisi, and Alberto Scandurra. "Spidergon: a novel on-chip communication network" Copyright 2004 IEEE. 0-7803-8558-6/04. p. 15.

Dally, William J. and Charles L. Seitz. "Deadlock-Free Message Routing in Multiprocessor Internconnection Networks" IEEE Transactions on Computers, vol. C-36, No. 5, May 1987. pp. 547-553.

Dally, William J. "Virtual-Channel Flow Control" Artificial Intelligence Laboratory and Laboratory for Computer Science, Massachusetts Institute of Technology. Copyright 1990 IEEE, CH2887-8/90/0000/0060.

Davis, John D., James Laudon, Kunle Olukotun. "Maximizing CMP Throughput with Mediocre Cores" Published 2005. Proceedings of the 14th International Conference on Parallel Architectures and Compilation Techniques. pp. 51-62.

Drost, Robert J. "Proximity Communication" Sun Microsystems Research Laboratories. 2004 Sun Labs Open House.

Ebeling, Carl, Darren C. Cronquist, and Paul Franklin. "RaPiD—Reconfigurable Pipelined Datapath" Department of Computer Science and Engineering, University of Washington.

Fang, Jiandong, and Karl F. Böhringer. "Wafer-Level Packaging Based on Uniquely Orienting Self-Assembly (The DUO-SPASS Processes)" Department of Electrical Engineering, University of Washington. Journal of Microelectromechanical Systems, vol. 15, No. 3, Jun. 2006. IEEE 1057-7157. pp. 531-540.

Greenberg, Ronald I. "The Fat-Pyramid and Universal Parallel Computation Independent of Wire Delay" IEEE Transactions on Computers, vol. 43, No. 12, Dec. 1994. pp. 1358-1364.

Hu, Jingcao, Umit Y. Ogras, and Radu Marchlescu. "System-Level Buffer Allocation for Application-Specific Networks-on-Chip Router Design" IEEE Transactions on Computer-Aided Design of Integrated Circuits and Systems, vol. 25, No. 12, Dec. 2006. pp. 2919-2933.

Huber, Dale L., Ronald P. Manginell, Michael A. Samara, Byung-II Kim, Bruce C. Bunker. "Programmed Adsorption and Release of Proteins in a Microfluidic Device" *Science* 301 (2003). pp. 352-354.

Huh, Jaehyuk, Stephen W. Keckler, and Doug Burger. "Exploring the Design Space of Future CMPs" Computer Architecture and Technology Laboratory, Department of Computer Sciences, University of Texas at Austin. Proceedings of the 2001 International Conference on Parallel Architectures and Complilation Techniques (PACT 2001).

Jalabert, Antoine, Srinivasan Murali, Luca Benini, and Giovanni De Micheli. "xpipesCompiler: A tool for instantiating application specific Networks on Chip" Proceedings of the Design, Automation and Test in Europe Conference and Exhibition, Copyright 2004 IEEE. 1530-1591/04.

Kalla, Ron, Balaram Sinharoy, and Joel M. Tendler. "IBM Power5 Chip: A Dual-Core Multithreaded Processor" Published 2004 IEEE Computer Society. pp. 40-47.

Kanda, Kouichi, Danardono Dwi Antono, Koichi Ishida, Hiroshi Kawaguchi, Tadahiro Kuroda, and Takayasu Sakurai. "1.27Gb/s/pin 3mW/pin Wireless Superconnect (WSC) Interface Scheme" Copyright 2003 IEEE. 0-7803-7707-9/03.

Kim, John, William J. Dally, and Dennis Abts. "Flattened Butterfly: A Cost-Efficient Topology for High-Radix Networks" Copyright 2007 ACM 978-1-59593-706-3/07/0006.

Kirman, Nevin, Meyrem Kirman, Rajeev K. Dokania, José F. Martinez, Alyssa B. Apsel, Matthew A. Watkins, and David A. Albonesi. "Leveraging Optical Technology in Future Bus-based Chip Multiprocessors" $39^{th}$ Annual IEEE/ACM International Symposium on Microarchitecture, Copyright 2006 IEEE. 0-7695-2732-9/06.

Knickerbocker, J.U., P.S. Andry, L.P. Buchwalter, A. Deutsch, R.R. Horton, K.A. Jenkins, Y.H. Kwark, G. McVicker, C.S. Patel, R.J. Polastre, C. Schuster, A. Sharma, S.M. Sri-Jayantha, C.W. Surovic, C.K. Tsang, B.C. Webb, S.L. Wright, S.R. McKnight, E.J. Sprogis, and B. Dang. "Development of next-generation system-on-package (SOP) technology based on silicon carriers with fine-pitch chip interconnection" IBM J. Res. & Dev. vol. 49, No. 4/5, Jul./Sep. 2005. pp. 725-753.

Kumar, Amit, Li-Shiuan Peh, Partha Kundu, and Niraji K. Jha. "Express Virtua Channels; Towards the Ideal Interconnection Fabric" Copyright 2007 ACM 978-1-59593-706-3/07/0006. pp. 150-161.

Kuon, Ian, and Jonathan Rose. "Measuring the Gap between FPGAs and ASICs" Copyright 2006 ACM 1-59593-292-5/06/0002.

Landman, Bernard, and Roy L. Russo. "On a Pin Versus Block Relationship For Partitions of Logic Graphs" IEEE Transactions on Computers, vol. c-20, No. 12, Dec. 1971. pp. 1469-1479.

Leiserson, Charles E., Zahi S. Abuhamdeh, David C. Douglas, Carl R. Feynman, Mahesh N. Ganmukhi, Jeffrey V. Hill, W. Daniel Hillis, Bradley C. Kuszmaul, Margaret A. St. Pierre, David S. Wells, Monica C. Wong-Chan, Shaw-Wen Yang, and Robert Zak. "The Network Architecture of the Connection Machine CM-5" Thinking Machines Corporation, Cambridge, Massachusetts. Feb. 7, 1996.

Magnusson, Peter S., Magnus Christensson, Jesper Eskilson, Daniel Forsgren, Gustav Hallberg, Johan Hallberg, Fredrik Larsson, Andreas Moestedt, and Bengt Werner. "Simics: A Full System Simulation Platform" Copyright 2002 IEEE. 0018-9162/02. pp. 50-58.

Martin, Milo M.K., Daniel J. Sorin, Bradford M. Beckmann, Michael R. Marty, Min Xu, Alaa R. Alameldeen, Kevin E. Moore, Mark D. Hill, and David A. Wood. "Multifacet's General Execution-driven Multiprocessor Simulator (GEMS) Toolset" Appears in Computer Architecture News (CAN), Sep. 2005. http://www.cs.wisc.edu/gems.

Mick, Stephen, John Wilson, and Paul Franzon. "4 Gbps High-Density AC Coupled Interconnection" Copyright 2002 IEEE Custom Integrated Circuits Conference. 0-7803-7250-6/02. pp. 133-140.

Mullins, Robert, Andrew West, and Simon Moore. "Low-Latency Virtual-Channel Routers for On-Chip Networks" Proceedings of ISCA 2004. IEEE 1063-6897/04.

Murali, Srinivasan, Paolo Meloni, Federico Angiolini, David Atienza, Salvatore Carta, Luca Benini, Giovanni De Micheli, and Luigi Raffo. " Designing Application-Specific Networks on Chips with Floorplan Information" Copyright 2006 ACM 1-59593-389-1/06/0011. pp. 355-362.

Okamoto, Takumi, Tsutomu Kimoto, and Naotaka Maeda. "Design Methodology and Tools for NEC Electronics' Structured ASIC ISSP" Copyright 2004 ACM 1-58113-817-2/04/0004. pp. 90-96.

Pande, Partha Pratim, Cristian Grecu, Michael Jones, André Ivanov, and Resve Saleh. "Performance Evaluation and Design Trade-Offs for Network-on-Chip Interconnect Architectures" Copyright 2005 IEEE Computer Society. 0018-9340/05. pp. 1025-1040.

Rumpler, J., J.M. Perkins, and C.G. Fonstad Jr. "Optoelectronic Integration using Statistical Assembly and Magnetic Retention of Heterostructure Pills" EECS, Massachusetts Institute of Technology, Cambridge, Massachusetts.

Salzman, David, and Thomas Knight, Jr. "Capacitive Coupling Solves the Known Good Die Problem" Copyright 1994 IEEE. 0-8186-5560-7/94. pp. 95-100.

Singh, Hartej, Ming-Hau Lee, Guangming Lu, Fadi J. Kurdahi, Nader Bagherzadeh, and Eliseu M. Chaves Filho. "MorphoSys: An Integrated Reconfigurable System for Data-Parallel and Computation-Intensive Applications" IEEE Transactions on Computers, vol. 49, No. 5, May 2000. pp. 465-481.

Wang, Hangsheng, Li-Shiuan Peh, and Sharad Malik. "Power-driven Design of Router Microarchitectures in On-chip Networks" Published 2003. Proceedings of the 36th annual IEEE/ACM International Symposium on Microarchitecture.

Wu, Kun-Cheng, and Yu-Wen Tsai. "Structured ASIC, Evolution or Revolution!" Faraday Technology Corporation, Taiwan. Copyright 2004 ACM 1-58113-817-2/04/0004. pp. 103-106.

Xiong, Xiaorong, Yael Hanein, Jiandong Fang, Yanbing Wang, Weihua Wang, Daniel T. Schwartz, and Karl F. Böhringer. "Controlled Multibatch Self-Assembly of Microdevices" Journal of Microelectromechanical Systems, vol. 12, No. 2, Apr. 2003, pp. 117-127.

Yeh, Hsi-Jen J. and John S. Smith. "Fluidic Self-Assembly for the Integration of GaAs Light-Emitting Diodes on Si Substrates" IEEE Photonics Technology Letters, vol. 6, No. 6, Jun. 1994. pp. 706-708.

Yoo, Andy, Edmond Chow, Keith Henderson, William McLendon, Bruce Hendrickson, and Umit Catalyurek. "A Scalable Distributed Parallel Breadth-First Search Algorithm on BlueGene / L" Copyright 2005 ACM 1-59593-061-2/05/0011.

Zahiri, Behrooz. "Structured ASICs: Opportunities and Challenges" Proceedings of the 21$^{st}$ International Conference on Computer Design 2003 IEEE. 1063-6404/03.

* cited by examiner

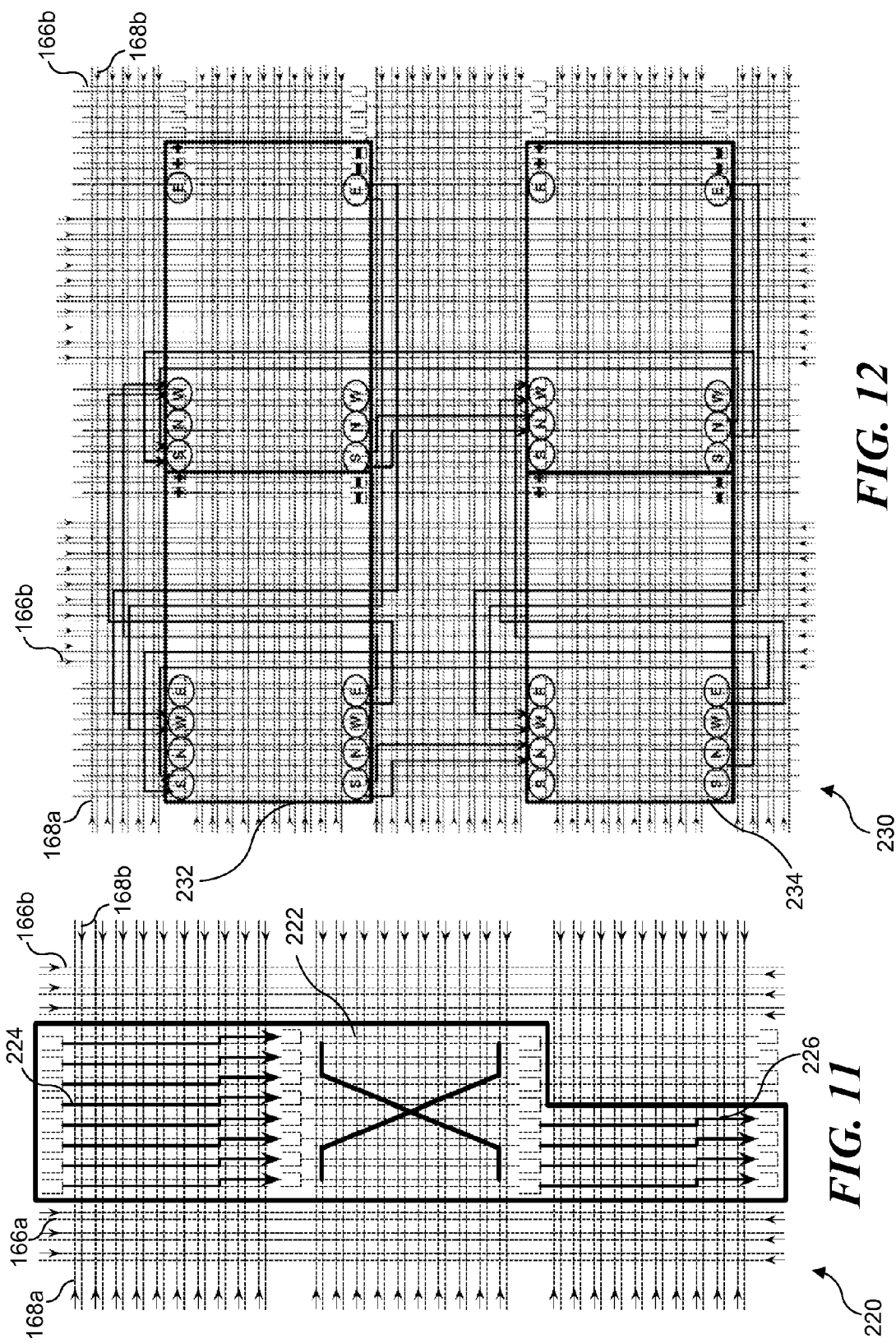

CUSTOMIZED SILICON CHIPS PRODUCED USING DYNAMICALLY CONFIGURABLE POLYMORPHIC NETWORK

RELATED APPLICATIONS

This application is based on a prior copending provisional application, Ser. No. 60/884,081, filed on Jan. 9, 2007, the benefit of the filing date of which is hereby claimed under 35 U.S.C. § 119(e).

BACKGROUND

Technology scaling has yielded a wealth of transistor resources and largely commensurate improvements in chip performance. These benefits, however, have come with an ever increasing price tag, due to rising design, engineering, validation, and application specific integrated circuit (ASIC) initiation costs. The result has been a steady decline in ASIC "starts." The cycle feeds on itself: fewer starts means fewer customers to amortize the high fixed cost of fabrication facilities, leading to further increases in start costs, and further declines in starts.

When designing a product, engineers must choose between two less than ideal options. Either they must face the high fixed costs of ASIC production, and hope to amortize it over a large volume of parts, or they must choose a field programmable gate array (FPGA) with low fixed costs, but high unit part cost. The trade-offs are not just financial. ASIC performance is 3.4-4.6× (i.e., about 3-5×) faster and power consumption is 14× less than FPGAs, and certain applications, such as cell-phones, will simply require an ASIC for these technical advantages. However, FPGAs bring in-field re-programmability, which is useful for accommodating changing standards. This requirement drives the need for a manufacturing technology that provides the key advantages of FPGAs—low fixed costs, and quick turn-around on designs, which lead to lower engineering cost—coupled with the key advantages of ASICs—low unit cost, high performance, and low power.

A key aspect of developing such technology will be the need to develop a network that can serve to interconnect components. On-chip networks play a critical role in the performance of computing systems, from high-speed network routers, to embedded devices, to chip multiprocessors (CMPs). As more functionality is progressively integrated on a single die, the communication infrastructure that binds the components will play a central role in overall chip performance. Researchers have developed a number of innovations in various aspects of network-on-chip (NoC) design, including novel topologies, routing algorithms, and switches optimized for latency, fault tolerance, and power consumption.

There are a handful of technologies that target the gaps between the performance, cost, power, and convenience of ASICs and FPGAs, as follows.

System on a Package (SoP): SoP is a technology where multiple silicon dies are packaged together into the same chip package. Commercially available SoPs that are known are essentially multi-chip modules (discussed below). However, research devices have been produced that use flip-chip bonding of multiple dies. Use of SoPs offers a way to lower package costs, but still rely upon users to design and pay for fabrication of the constituent ASICs that are bonded together. It would clearly be preferable to instead develop a market for pre-fabricated ASIC components that interconnect in a standard way, and for which the interconnecting scheme for the ASIC components is not fixed once the SoP chip has been fabricated.

Multi-chip modules (MCMs): An MCM or multi-chip module consists of multiple silicon integrated circuits that share a single package. MCMs have been in commercial use for over 30 years, with packages as large as 10 cm on a side in use. MCMs amortize the packaging area overhead across multiple components. The closer together a pair of communicating chips is, the faster they can transmit signals to each other. Sharing a single package brings these chips closer together.

Systems on a Chip (SoC): People build SoCs by purchasing functional blocks and integrating them into a single design. However, at the end of the day, an SoC consists of a single custom silicon die, while it would be preferable to assemble blocks that have already taken the physical, silicon form of components.

Structured ASICs: Structured ASICs, also sometimes called platform ASICs, are multi-layer circuits, where the circuitry in the bottom layers is fixed, and only the top couple of layers (typically 2 to 3) are custom. The bottom layers form an array of logic units (i.e., lookup tables, flip-flops). These units are connected as dictated by the designer via custom wiring implemented in the top layers. Implementing a circuit in this way reduces the non-recurring costs of an ASIC, because only the top layers are custom, and thus, fewer layers must be designed, verified, and have masks built. Furthermore, the circuit is largely composed of fixed logic, so if an application maps well onto the array, it will perform better than an FPGA implementation and consume less area, thereby reducing the unit cost. The structured ASIC market is expected to reach $1.3 B by 2010, siphoning off 3.5% of the anticipated $31.4 B ASIC market. Structured ASICs are currently commercially available at the 180 and 250 nm nodes through companies such as AMI Semiconductor, ChipX, eASIC, Faraday, Fujitsu, and NEC.

Coarse-Grained Reconfigurable Devices: In the gap between structured ASICs and FPGAs are a new class of coarse-grained reconfigurable devices. These chips consist of relatively large reconfigurable "objects," which are configurably connected FPGA-style. One startup, MathStar, Inc., recently introduced its second generation Field-Programmable Object Array (FPOA) family called Arrix, which supports 400 individually configured 16-bit objects connected via a 1 GHz programmable interconnect. A second startup, CSwitch, has announced an architecture consisting of configurable control, compute and switch nodes, connected via a 20-bit wide, 2 GHz interconnect fabric.

In some devices, these objects resemble processors. In some cases, they are targeted towards a specific class of applications, such as the picoArray™ from picoChip and wireless signal processing, while in other cases, such as QuickSilver, Ambric, and Cradle Technologies, the compute nodes are more general. In other devices, the entire device operates as a single reconfigurable processor.

Certain applications, such as HDTV decoding, map well onto these devices. Applications that map well generally contain significant amounts of traditional data parallelism, and operate on word-size chunks of data. Applications that do not map well are those that require specialized bit-level operations, and those with specific circuit requirements (e.g., analog-to-digital converters). It would be desirable to employ pre-made components that are readily interconnected to produce coarse-grained, configurable devices. Similar to the comparison to structured ASICs above, such an approach would provide the opportunity to mix and match both part types and fabrication technologies to produce a wider variety of coarse-grained chip devices.

FPGAs with Hard IP Cores: For years, FPGA manufacturers have provided complex fixed-logic cores inside their FPGA fabrics. For example, Virtex2Pro provides both fixed multipliers, SRAM blocks, and entire PowerPC cores. More recent products from Xilinx and Altera have become even more specialized, with specific FPGAs targeted at different market segments (e.g., the Xilinx "FX" series targeted at embedded processing, and the "SX" series aimed towards signal processing). The advantage to having these cores is that if a design requires them, they incur little of the area/delay/power overhead relative to an ASIC. The disadvantage is that the core selection is set by the FPGA manufacturers, with product offerings that are necessarily limited. It would be desirable to be able to synthesize a variety of complex logic functions cheaply into the same chip in contrast to these domain-specific FPGAs.

When developing a network that can bind pre-defined components together, it will be desirable to create one that can be readily configured after fabrication. No single fixed function network provides optimal performance across a range of traffic patterns. For example, a common network benchmark, uniformly random all-to-all communication, performs best with a network supporting direct non-local links, such as a fat tree, while a streaming-style benchmark is well suited for a simple mesh or ring network with efficient nearest neighbor communication support. Furthermore, even when optimal designs share a topology, the networks are provisioned very differently in terms of buffering and packet sizes. When an application is fixed, say in an embedded device such as an ASIC, the communication pattern is also likely to be fixed. The network should be tailored to a defined level of traffic without penalty. However, when an application and traffic pattern varies, as would likely be true in programmable devices, such as CMPs, overall performance suffers if there is no option to modify the network configuration.

To address this problem, it would be desirable to create a new type of on-chip network comprising a collection of building blocks that can be configured to function as an arbitrary network. The new type of network should support customization of network topology, link bandwidth, and buffering, all of which should be determinable post-fabrication, but prior to application runtime, thereby affording the opportunity to customize the network design to each application. Prior work indicates that there is significant opportunity to improve performance of a NoC by tailoring a network to a particular application. Currently, however, it has not been possible to realize these benefits with a single hardware configuration, since conventional networks on a chip cannot be configured in this manner.

SUMMARY

The following discussion addresses the problems noted above using a technology, which was previously referred to by its developers as a technique for "brick and mortar" silicon chip production. This terminology was chosen by its developers because it seemed that the novel approach they had developed was generally analogous to conventional brick and mortar construction techniques. In this new technology, the "bricks" are mass-produced pieces of silicon semiconductor that might be processor cores, memory arrays, small gate arrays, DSPs, FFT engines, or any other functional blocks, and the "mortar" comprises an I/O cap that has been developed and which serves as a polymorphic network. The polymorphic network is a mass-produced silicon substrate, which binds two or more electronic components (or bricks) together to produce an overall functional component, much as cement mortar binds conventional bricks together into a coherent useful mass. Using this new approach, engineers can design products with a plurality of pre-produced components and the polymorphic network. The components can be assembled into an application-specific layout, and this arrangement of components is then bonded to the polymorphic network substrate, which can selectively interconnect them in various different ways, determined before (or even modified during) runtime of an application. The interconnection scheme that is used for the polymorphic network can be selected to provide an optimal configuration and can even be dynamically varied as a specific application requires.

One of the differences between the novel technique and existing approaches, such as system on a chip (SoC) design flows, is that the electronic components and polymorphic network are manufactured separately and bonded together using flip-chip techniques. With existing approaches, functional blocks are provided to engineers as "gateware" netlists, and engineers integrate them into a specified chip design, which is then manufactured. With the new approach described in detail below, functional blocks (the electronic components) can be provided to designers as real physical entities—small chips, which are physically assembled to produce a final product, and the network combining the functional blocks can be dynamically altered as appropriate to achieve a optimum connection scheme.

The vision contemplated by the present approach is that components are the modern-day analogue of the 7400™ series of logic, and the polymorphic network is the modern wire-wrap board. Rather than produce custom ASICs for products, engineers can instead purchase these prefabricated components and bond them together using a polymorphic network as needed to produce a desired product.

The key advantages of this novel type of production stem from the mass-production of its constituent parts. The components are produced in conventional ASIC processes, and hence, chips produced with the novel component and polymorphic network process gain the advantages of an ASIC: i.e., low power and high performance. Although they are ASICs, the components used in this technique are small, resulting in lower design and verification costs. Once designed and verified, they can be produced in bulk and used in a variety of very different end-user products. Thus, the cost of a silicon chip produced by this novel technique is low. Finally, silicon chips created using this novel approach are designed to be mass-produced, using a low-cost, fluidic self-assembly process or other low-cost physical assembly techniques.

To make chip production using this novel approach successful, the architecture of both components and the polymorphic network must be carefully designed. It is important to select appropriately sized components with useful functionality. Larger components provide more area to interface to the polymorphic network, and consequently, more inter-component bandwidth. Larger components also integrate more logic and memory together, thereby increasing circuit performance and decreasing latency between components in the resulting chip. In contrast, smaller components offer more design flexibility, and because they are less specialized, more potential re-use across different designs. It is important to find an appropriate balance of integration and generality in component function for this technology.

The "mortar" that implements the polymorphic network is another silicon component providing inter-component communication, and contains wiring, routing, and logic resources. Networks that are specialized to their application save logic space on a chip. On the other hand, if the network is too specialized, it does not perform well when re-used across a variety of "brick" (component) arrangements or traffic patterns. Thus, enabling network flexibility is a central driving theme behind polymorphic network design.

Instead of simply using the polymorphic network as a supporting semiconductor substrate on which bare electronic component dies are bonded, an alternative exemplary embodiment can employ the polymorphic network to configurably interconnect ports of one or more functional components that are included in the same die as the polymorphic network. For example, a multiprocessor chip can be formed by including processor functional components in the same die as a polymorphic network that provides the interconnection scheme for ports on the multiple processors. Different interconnect schemes can then be used by loading appropriate configuration data into memory registers so that the data define the interconnection between broadcast conductors on the polymorphic network.

The following discussion describes and evaluates several designs for component and polymorphic networks and discusses an exemplary method for fabricating such custom chips. To make this method of producing chips viable, the architecture of both components and polymorphic networks must be carefully engineered. A design study of these components shows that three physical sizes of components (e.g., 0.25 mm$^2$, 1 mm$^2$, and 4 mm$^2$) are sufficient to contain the functional blocks evaluated in the examples discussed herein; however, these sizes are not to be considered limiting, since certain applications may require different ranges of physical size components. Using such components and a polymorphic network designed for both packet-switched communication and FPGA island-style, mesh routing communication, it is possible, for example, to build a variety of chip multiprocessor (CMP) products. These CMPs can perform within 8% of a design built with a traditional ASIC design process. Moreover, the following discussion demonstrates how to exploit transistor speed variations across component production to actually build component and polymorphic network chips that are faster than a traditional ASIC process can provide. Finally, the discussion presented herein describes how to build component and polymorphic network chips from a low-cost fluidic self-assembly process and explains how this manufacturing process interplays with the architectural decisions both component and application chip designers will make. Specifically, it has been found that designing chip architectures that permit a small amount of slack in component placement on the polymorphic network can lead to a factor of 10 improvement in the rate of component and mortar chip production.

With an exemplary polymorphic architecture, the following discussion shows how to customize network topology, link bandwidth, and buffer capacity. The polymorphic network pays for this flexibility with additional area over-head. Using pareto optimal interconnect designs from an initial design space, the polymorphic network design space is explored in the discussion below, enabling identification of the polymorphic network designs that incur the least area overhead relative to fixed hardware implementations. The most efficient examples of the architecture proposed incur a 38% increase in interconnect area, which, with an interconnect comprising 15% of the die, represents only 6% of total die area.

More specifically, a customizable semiconductor chip is described that includes at least one functional electronic component. Each functional electronic component has a plurality of first connection ports used for input and output of electrical signals. A polymorphic network is included in the customizable semiconductor chip and comprises a semiconductor substrate on which at least one functional electronic component is bonded. The polymorphic network includes a plurality of second connection ports that are electrically connected to the first connection ports, and a plurality of signal conveyance resources for selectively interconnecting specific ones of the second connection ports to specific other ones of the second connection ports in a desired interconnection scheme. The desired interconnection scheme can be modified up to a time that an application that will use the desired interconnection scheme is run by the customizable semiconductor chip.

At least some embodiments of the polymorphic network comprise a plurality of regions that are interconnected by selectively configurable crossbars. Each region includes a plurality of selectively configurable slices. Each selectively configurable slice includes an input queue, a router that determines a route for data, and broadcast conductors for the route. Also included in a slice are configurable data connections, and an arbiter that controls data flow. The plurality of selectively configurable slices are disposed in clusters to form each of the plurality of regions and are interconnected by double crossbars that enable redefinition of input connections and output connections between the slices in accord with the desired interconnection scheme. In at least some exemplary embodiments, the double crossbars are segmentable, enabling slices on one or more regions to function together as a switch.

The router in a slice determines to which output connection a first packet in the input queue should be routed, and the arbiter grants access to an output connection for one packet at a time. In one exemplary embodiment that uses wormhole arbitration, a lead packet of a message includes information specifying a predefined route for the message through the polymorphic network. The routers and the arbiters in the slices respond to the information by establishing interconnections to achieve the predefined route for all subsequent packets belonging to the message.

The selectively configurable crossbars that are disposed between the regions comprise a plurality of switches that are selectively set in a state that achieves the desired interconnection scheme.

The polymorphic network also includes memory registers into which configuration data defining the desired interconnection scheme within the polymorphic network are written. The configuration data are written to the memory registers at least by a time that an application that will use the desired interconnection scheme is loaded to run on the customizable semiconductor chip. A plurality of switches access the configuration data stored in the memory registers to establish internal and external interconnections and functionality of the polymorphic network. Thus, by modifying the configuration data, a different desired interconnection scheme and functionality is achieved in the polymorphic network.

Another aspect of this technology is directed to a polymorphic network that is configured to interconnect ports and to enable redefining interconnections between the ports of one or more functional components. The polymorphic network comprises a semiconductor substrate that includes a plurality of ports adapted to electrically connect to corresponding ports on one or more functional components, and input connections adapted for coupling the semiconductor substrate into an external circuit. A plurality of configurable data connections are provided and can be selectively set to open or close conductive paths between and through specific electrical conductors in the polymorphic network. Memory registers store connection data defining states of the configurable data connections to achieve a desired interconnection scheme for electrically interconnecting the plurality of ports of the polymorphic network. The states of the configurable data connections are modifiable at any time until an application that will use the polymorphic network is run.

A plurality of regions on the polymorphic network are interconnected by crossbars in an interconnection layout that is specified by the connection data stored in the memory registers. Each region includes a plurality of slices that are also interconnected as specified by the connection data, and each slice includes an arbiter and a router for controlling data flow in the slice.

The configurable data connections comprise a plurality of switches in one exemplary embodiment of the polymorphic network. The switches are selectively set in response to the connection data to achieve the desired interconnection scheme.

In at least one exemplary embodiment, the ports are configured to be electrically coupled to one or more functional components that comprise one or more separate discrete electronic components, using a flip-chip technique so that the polymorphic network supports the one or more electronic components. The semiconductor substrate is intended to be used with a plurality of different applications that differ at least in part by the interconnections provided by the polymorphic network, using specific different desired interconnection schemes.

In at least another different exemplary embodiment, the polymorphic network functions as an on-chip network, for interconnecting one or more functional components that are included in a semiconductor die on which the polymorphic network is formed. The connection data are bit mapped to the plurality of configurable data connections, and the connection data determine an open state or a closed state of each of the plurality of configurable data connections.

The semiconductor substrate will typically include conductors that distribute electrical power to energize one or more functional components and will route any required clocking signals to the one or more functional components.

Wormhole arbitration can be used to define a path for packets of each message conveyed by the polymorphic network. In this case, a lead packet of the message includes information that specifies a route for routing subsequent packets of the message between ports.

A further aspect of this technology is directed to a method that includes steps generally consistent with the immediately preceding discussion of the polymorphic network.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein:

FIG. 1 is a schematic diagram illustrating the novel component and mortar silicon chip design in which mass produced ASIC components are assembled in a custom, per-design fashion, and bonded to a polymorphic network providing a flexible, high-performance interconnect for components to communicate when bonded together using I/O pads that cover the surface of both the components and the polymorphic network;

FIG. 2A is a schematic diagram indicating a first inter-brick interconnect for a dynamically-routed, packet-switched network (i.e., a first exemplary embodiment of the "mortar" portion of the "brick and mortar" concept) with variable communication in which routers are represented by circles and are organized into a 4-ary fat tree and in which black routers represent valid routing destinations for the exemplary brick layout;

Figure 4:
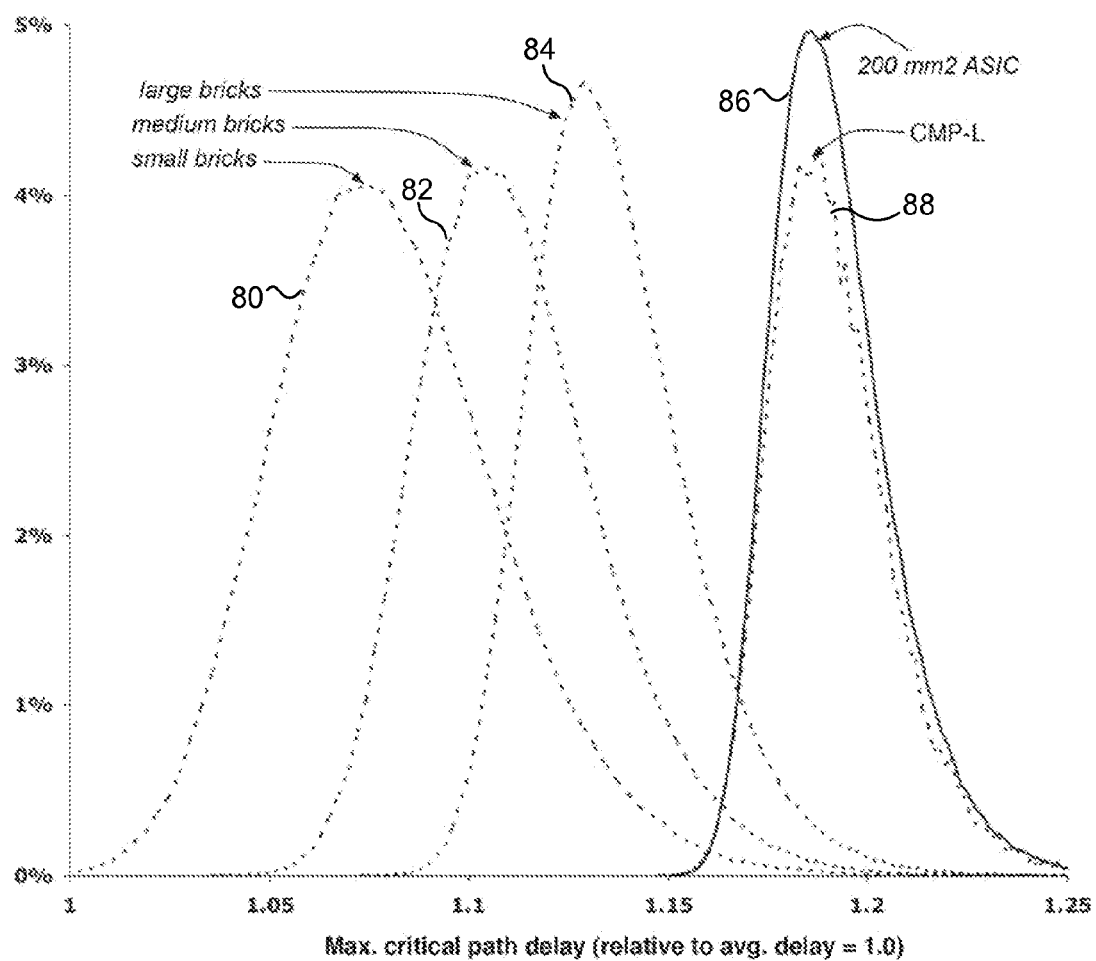
Figure 5:
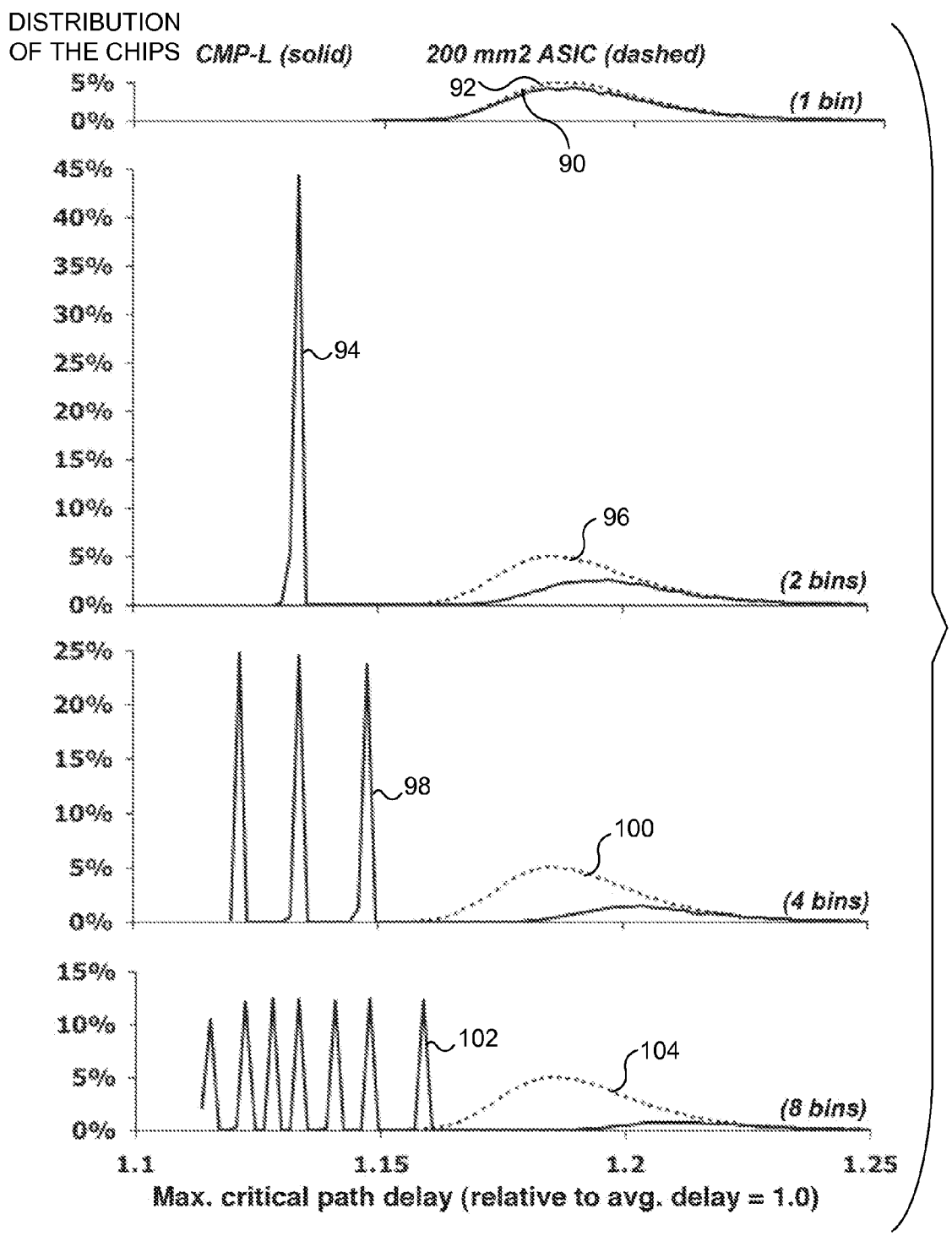
Figure 6:
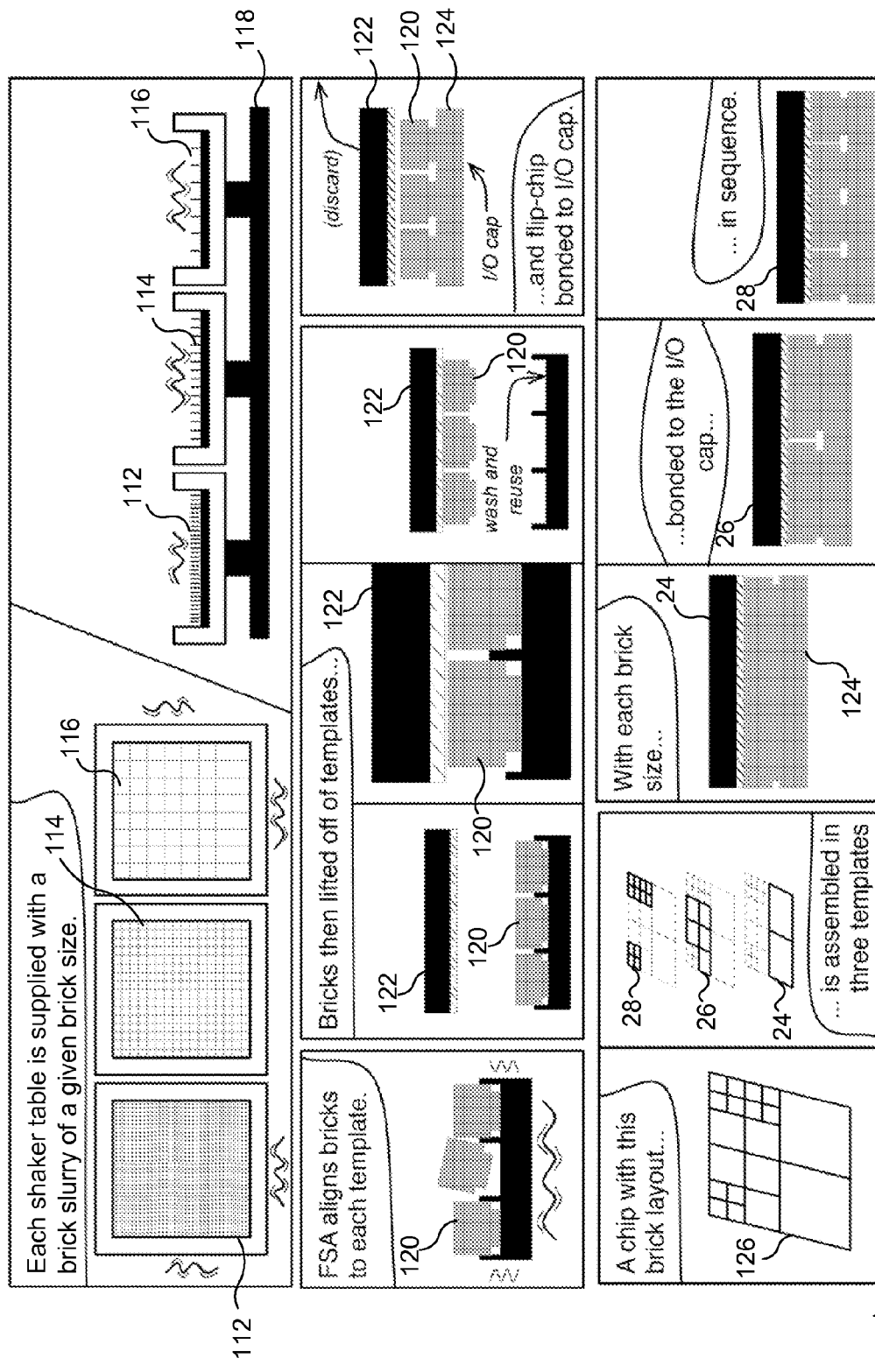
Figure 7:
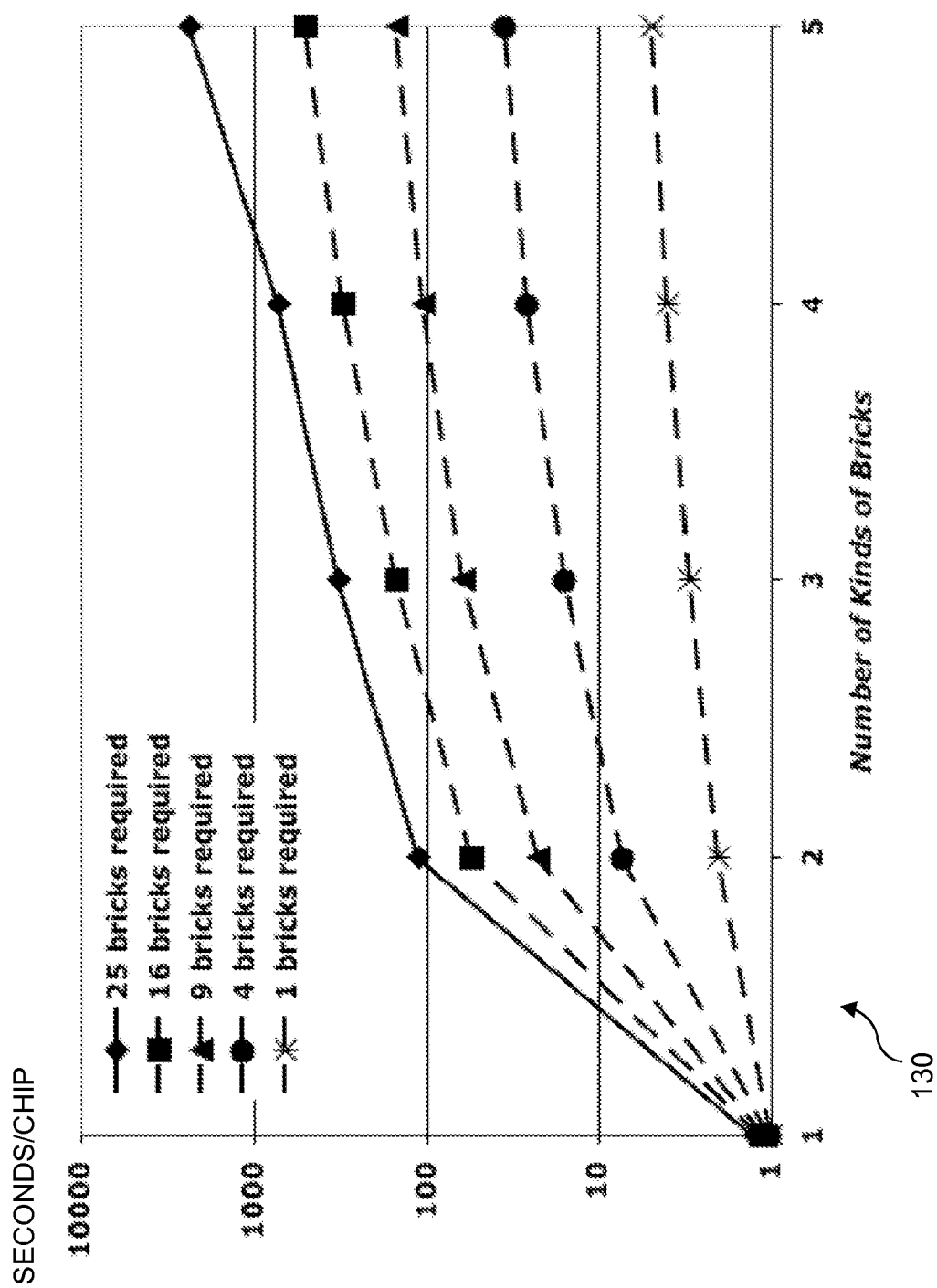
Figure 8:
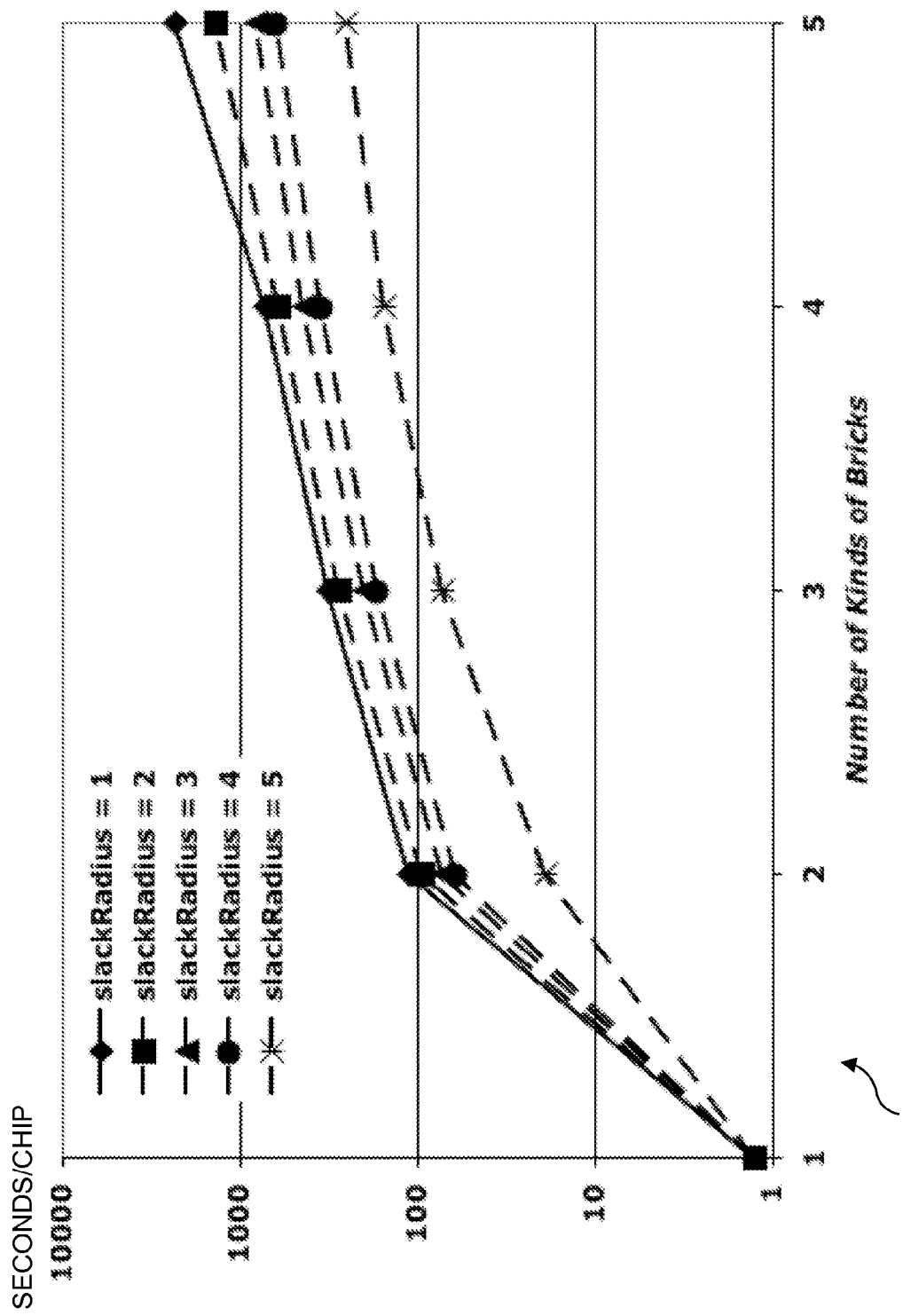
Figure 9:
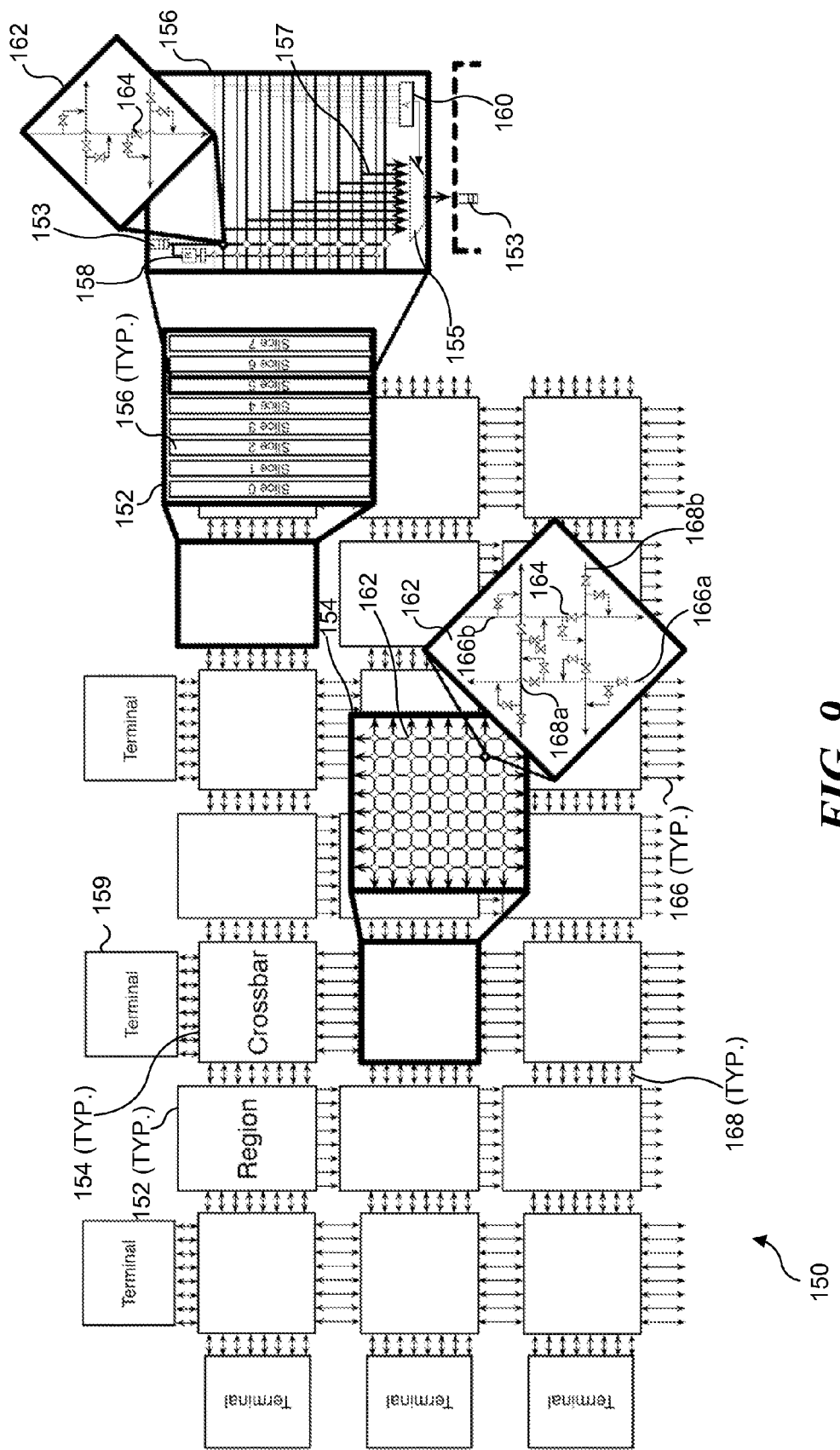
Figure 10:
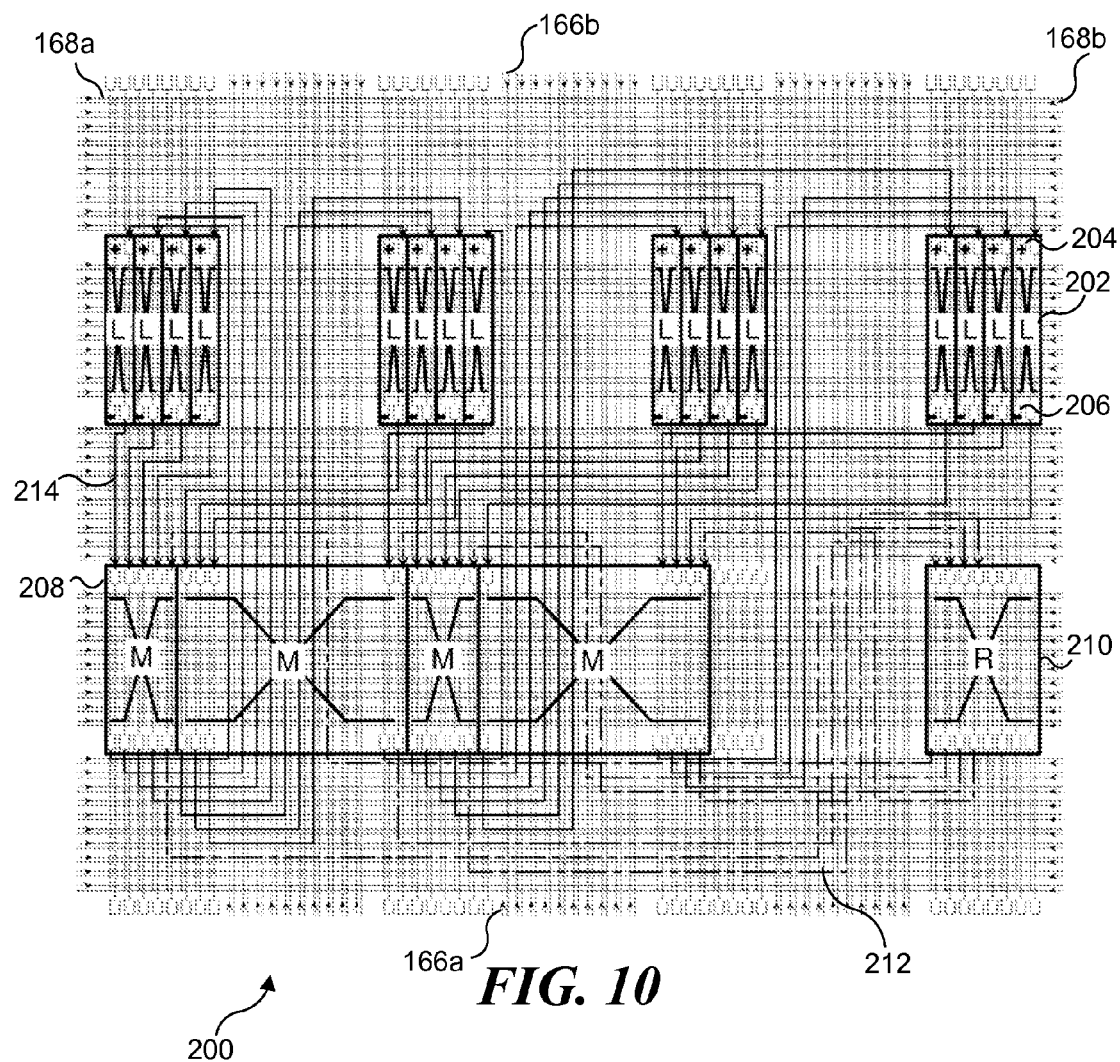
Figure 13:
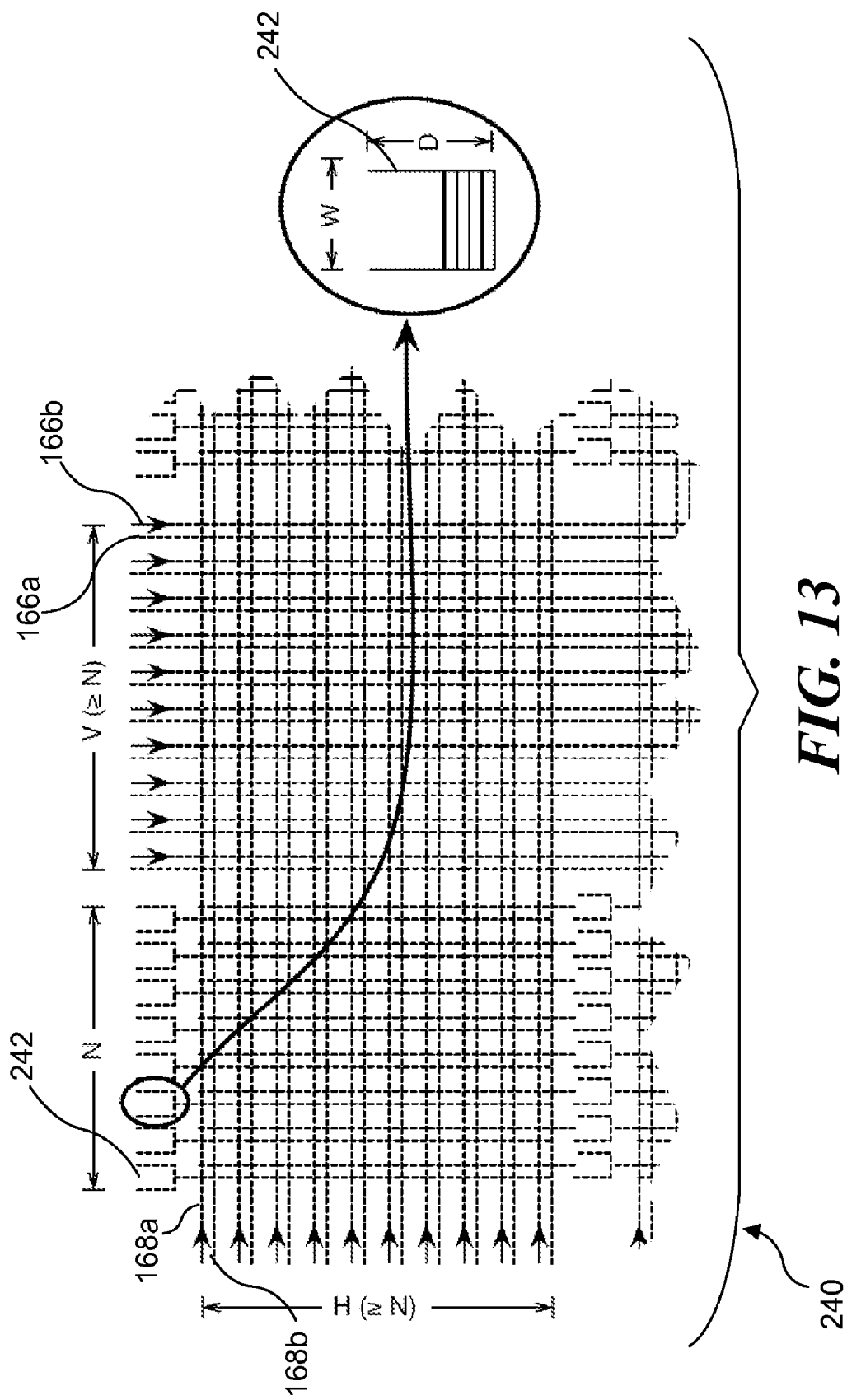
Figure 14:
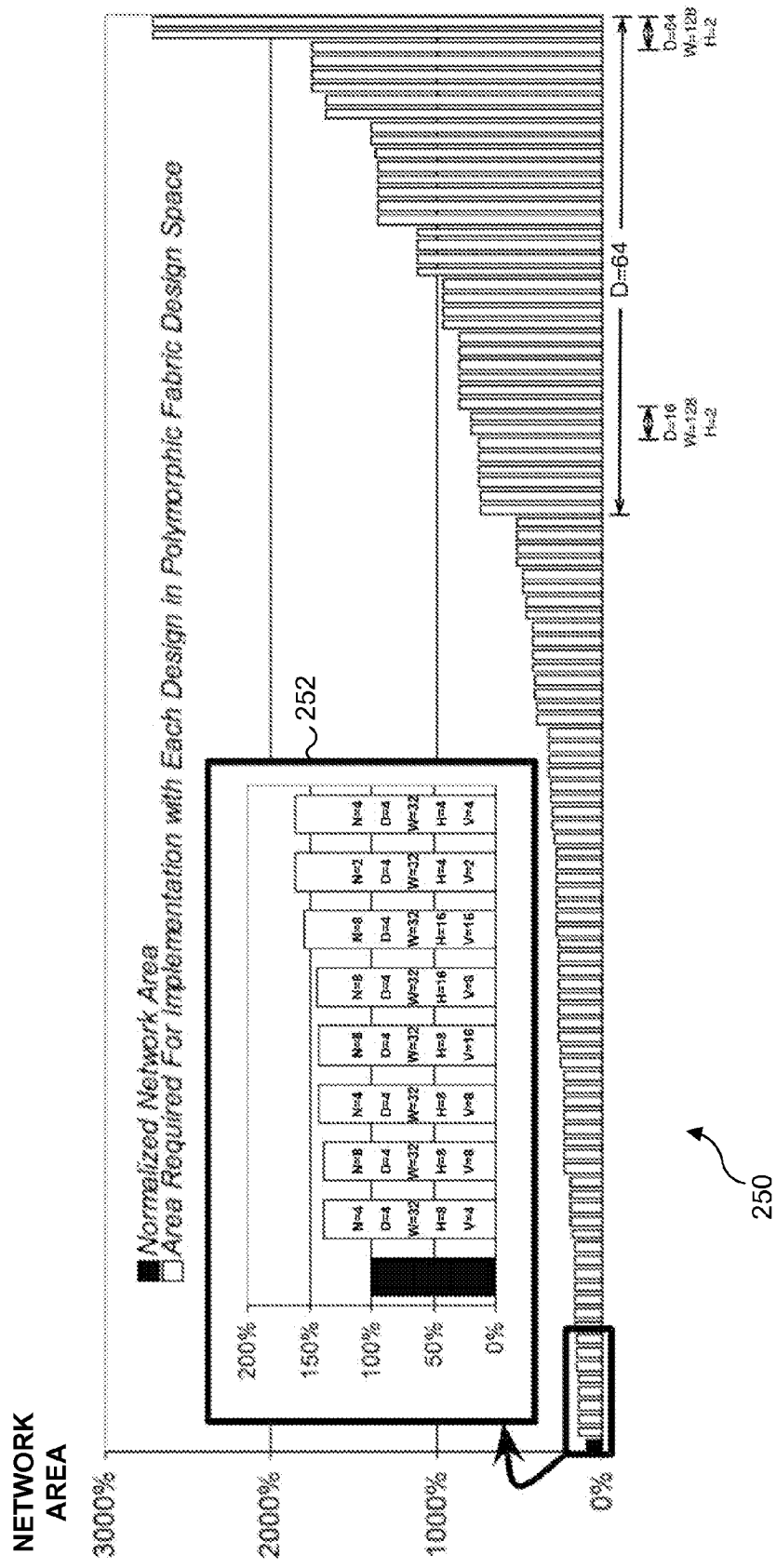
Figure 15:
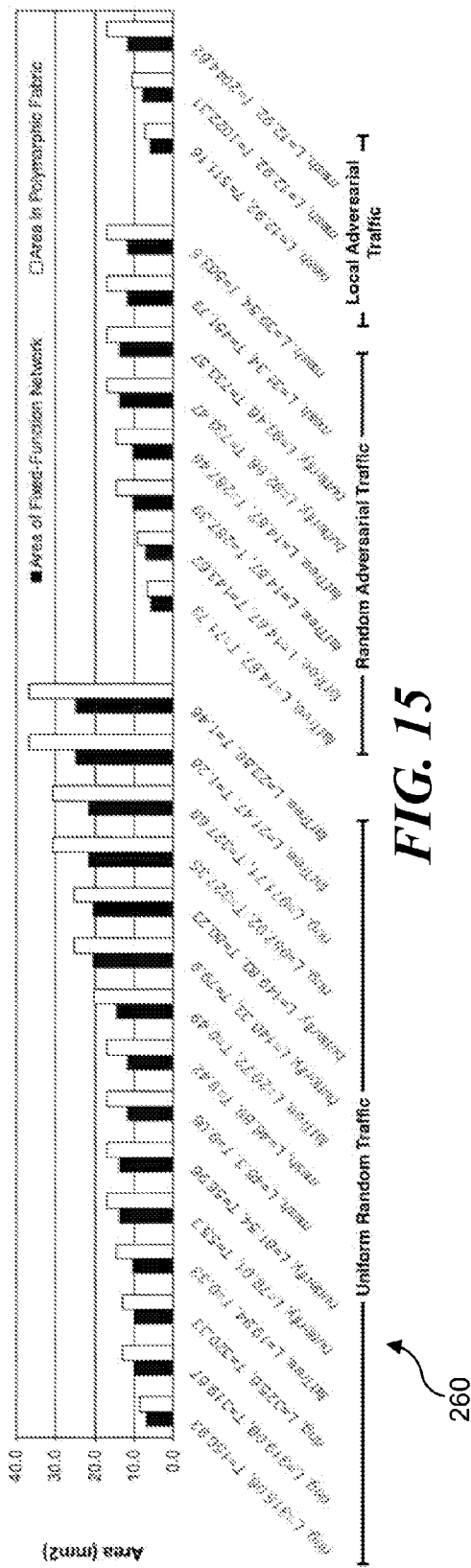
Figure 16:
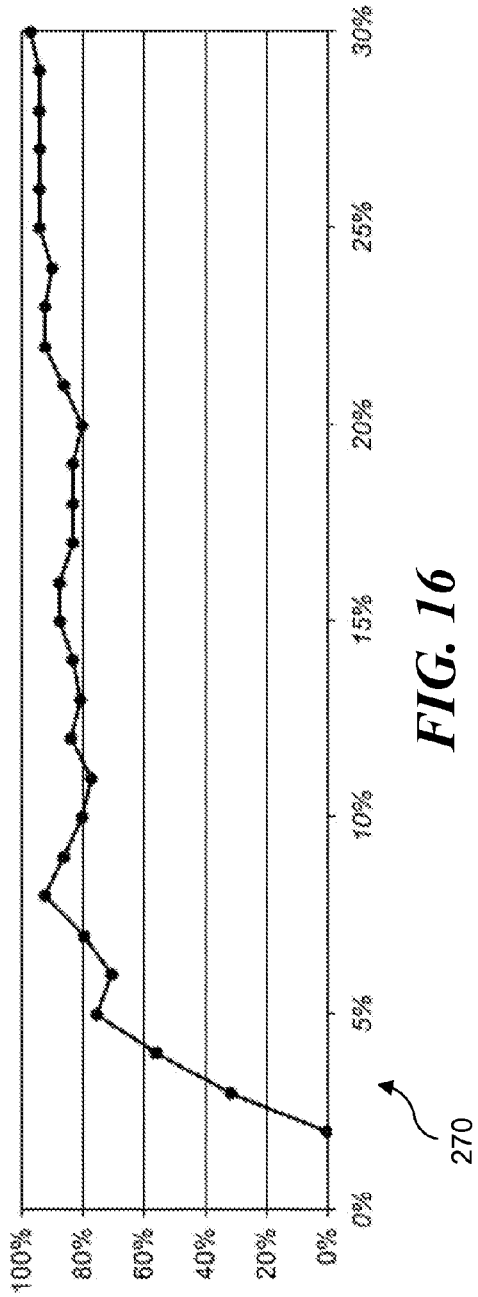

FIG. 4 is a graph depicting the expected speeds of a 200 $mm^2$ ASIC, and the same ASIC produced with the component and mortar process (the solid line), wherein the horizontal axis shows the variation in maximum critical path delays relative to an average critical path delay of 1.0, and the vertical axis shows the percentage of chips with a particular maximum critical path delay (the area under each of these curves sums to 100%);

FIG. 5 illustrates speed binning graphs depicting the expected worst case critical paths for CMP-L using no speed grading (top), using two bins (2nd down), using four bins (next down), and using eight bins (bottom), and also showing the distribution of the worst case critical path for an ASIC version of the same chip, illustrating the advantage of selecting same-speed components for inclusion in a component and mortar CMP assembly; while the slowest chips suffer just as much poor variation as a monolithic ASIC of the same size, the fastest chips can be much faster because they purposefully do not include slow circuit paths;

FIG. 6 is a schematic block diagram showing that to assemble a component and mortar chip, the components can be arranged programmatically using fluidic self-assembly (FSA) that requires one FSA process (and optionally more) per component size and occurs on a template with holes matching the components in shape and size, so that the assembly process can select components based on the desired type, speed, and functionality, and once assembled, components can be robotically lifted from the templates and bonded to the polymorphic network;

FIG. 7 is a graph showing how fluidic self-assembly time increases exponentially with both the number of components to be assembled and the number of types of components;

FIG. 8 is a graph showing that by allowing some flexibility in the component placement, it is possible to significantly reduce the time required to assemble a complete set of components on a polymorphic network with fluidic self-assembly;

FIG. 9 is a schematic diagram of an exemplary polymorphic network formed from a repeating pattern of "regions" and "crossbars," where the connections within the crossbar are statically configurable, the regions comprise an array of slices, and each "slice" includes a network switch having an input queue, a router, potential switch crossbar connections, and an arbiter;

FIG. 10 is a schematic diagram illustrating the placement of switches and routing of links of a piece of a fat tree topology on the polymorphic network fabric, where the fat tree is four-way with three levels, and illustrating the sub tree beneath one root node;

FIG. 11 is a schematic diagram illustrating how the polymorphic fabric supports variable queue depths by serially linking and showing that the queues in a switch need not all have the same depth;

FIG. 12 is a schematic illustration showing how the polymorphic network can aggregate parallel queues (and links) to construct wider queues and accommodate wider packets, as in the above small mesh;

FIG. 13 is a portion of an exemplary polymorphic network, illustrating exemplary polymorphic fabric design parameters;

FIG. 14 is a graph comparing the area efficiency of the polymorphic network design points;

FIG. 15 is a graph showing polymorphic overhead across networks, where the black bars indicate the area of each of the pareto optimal fixed-function networks, and the white bars indicate the area required by a polymorphic network to implement each network; and FIG. 16 is a graph illustrating the sensitivity of polymorphic network coverage to the area budgeted for the polymorphic network.

DESCRIPTION

Figures and Disclosed Embodiments are Not Limiting

Exemplary embodiments are illustrated in referenced Figures of the drawings. It is intended that the embodiments and Figures disclosed herein are to be considered illustrative rather than restrictive. No limitation on the scope of the technology and of the claims that follow is to be imputed to the examples shown in the drawings and discussed herein.

The Potential of Component and Polymorphic Network Chips

Figure 1:
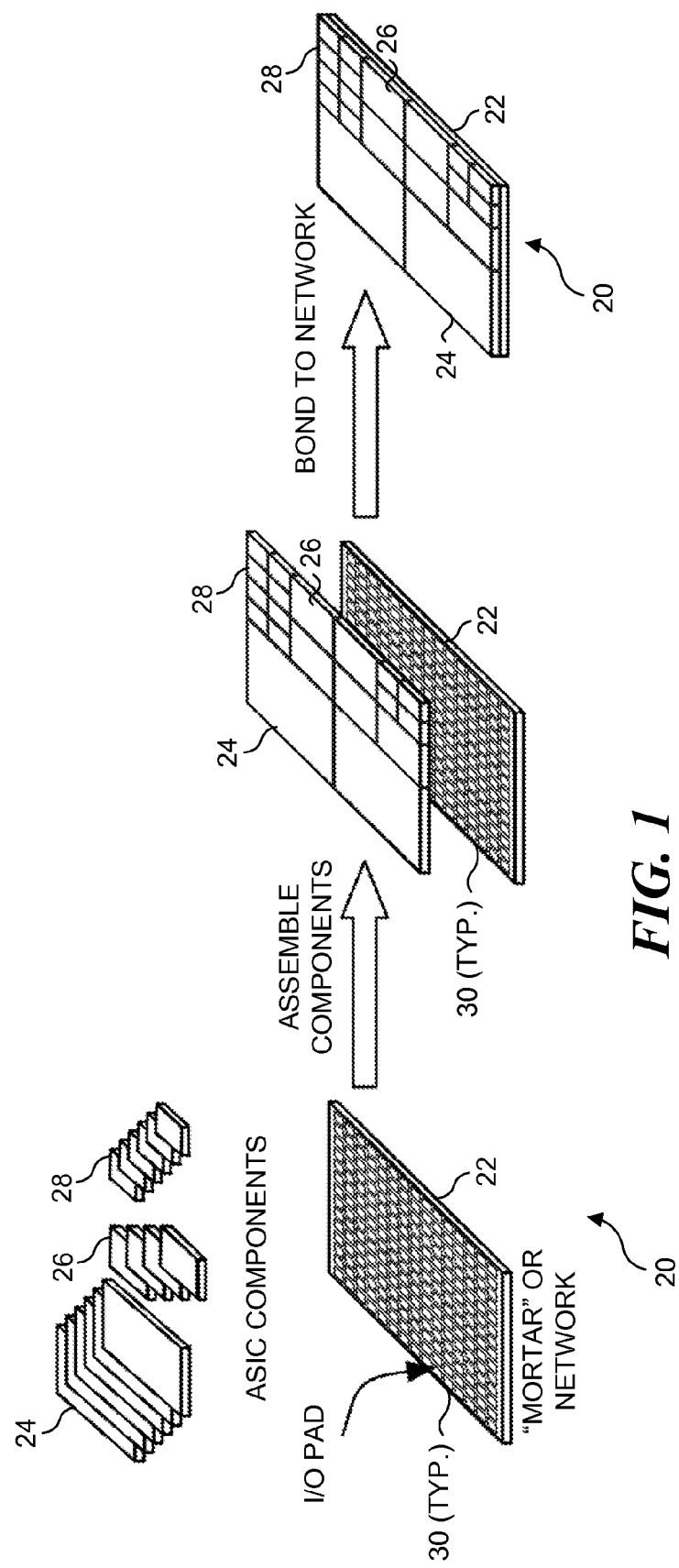

At the heart of the component and polymorphic network chip manufacturing process are two architectural components: a component and a polymorphic network. Components are physical pieces of silicon that contain a functional block size component (processors, networking interfaces, small gate arrays, etc.). A polymorphic network is another silicon die that contains the inter-component communication infrastructure. An exemplary component and polymorphic network manufactured chip includes several components, arranged into an application specific layout, that are bonded to the polymorphic network substrate. Once components are bonded to the polymorphic network, the polymorphic network provides power and clock to the components and polymorphic network abilities that enable the components to communicate with each other and the outside pins of the chip package. FIG. 1 schematically depicts the steps involved in creating an exemplary component layout in according the present novel approach, showing the polymorphic network 22 to which the I/O pads (not shown in this Figure) of a plurality of large components 24, medium size components 26, and small components 28 are flip-chip bonded to I/O pads 30 to form a component and polymorphic network silicon chip 20.

Before delving into the architectural components of component and polymorphic network chip design, it may be helpful to appreciate the key qualitative reasons for pursuing this line of research. Most of these issues are revisited below with a more quantitative analysis.

Reduced cost: As discussed above, an important motivation for this research was to produce a low-cost alternative to ASIC chip production. The section presented below that is entitled "Related Work" describes other technologies with comparable goals. With the component and polymorphic network approach, cost reductions are achieved by using mass produced components and polymorphic networks in a variety of end-user chip applications and enabling the interconnection between the components to be readily modified to achieve a desired optimal result.

Compatible design flow: Today, ASIC designers employ significant amounts of existing technology to produce chips, which saves design time and cost. A component and polymorphic network is compatible with this design flow, and merely moves the functional blocks from design modules that fit into synthesis tool flows, to physical components used in chip assembly in accord with the present method.

ASIC-Like Speed and Power: Because most of the logic of component and polymorphic network chip designs exists in fixed functional cores, their performance (speed and power) will tend to be closer to that of ASICs than that of FPGAs. Small gate array components can be used to implement any small custom logic.

Mixed process integration: As shown below, it may be desirable for components to fit to standard form factors and interfaces. They do not, however, have to be built from the same underlying technology. This fact offers an easy way to mix and match bulk complementary metal-oxide semiconductor (CMOS), silicon on insulator (SOI), dynamic random access memory (DRAM) and other process technologies into the same chip.

Improved speed: A subtle positive effect with component and polymorphic network chip production is that it can potentially produce higher-performance large chips than an ASIC process. Components can be partitioned according to speed grade, prior to the component and polymorphic network assembly, and chips can be produced from parts having the same speed grade.

Improved yield: Similar to the benefits arising from appropriate handling of speed variation, large component and polymorphic network-produced chips can have a higher yield than large ASICs. Again, the advantage comes from using small components, which have a higher yield rate than a large ASIC. These components can be tested prior to being assembled with the component and polymorphic network method, and thereby, the yield of a large component and polymorphic network chip can be extremely high.

These advantages do not come for free, however. Component and polymorphic network assembly is likely to be viable only if its components are architected correctly. The following discussion presents the results of an exemplary architectural analysis and begins by explaining an exemplary design of the component and polymorphic network components.

In some sense, component and polymorphic network is the dual of a structured ASIC. While structured ASIC provides a fixed array of blocks with a custom interconnect on top, component and polymorphic network offers a custom array of components, with a non-custom, reconfigurable interconnect to connect them. In addition, component and polymorphic network's components can be used to provide larger chips, with more complex functions than the lookup tables and RAMs of structured ASICs. Because component and polymorphic network requires that components fit a standard form factor to interact with the polymorphic network, some logic area might go to waste. Structured ASICs have a custom interconnect and are therefore not subject to this restriction on the logic blocks. However, structured ASICs cannot be readily reconfigured to dynamically modify the interconnections between the ASIC components.

Architectural Questions

Components: There are three important architectural questions that are of interest to a designer. They are: (1) how do components communicate; (2) how large is a component; and, (3) what is the appropriate functionality for components to provide? To answer these questions, the following discussion begins by investigating how the physical constraints placed on components influence the architectural decisions.

What are the goals and constraints of inter-component communication? The primary architectural constraint on inter-component communication is that components must communicate with other components through the polymorphic network. For example, as shown in FIG. 1, flip-chip style bonding connects the I/O pads of each component to I/O pads 30 on polymorphic network 22. Studies indicate that each bonding bump might be about 25 μm×25 μm in area and can provide at least 2.5 Gbps bandwidth.

Table 1 (Functional Block Synthesis and Component Assignment), which is shown below, indicates the synthesis-produced area and timing characteristics of each component-candidate functional block. Each block has been assigned to the smallest component that meets its area and bandwidth constraints. Note how some of the blocks that have been assigned to small components could take advantage of the increased I/O bandwidth afforded by larger components (indicated by the increased frequency range).

TABLE 1

Functional Block Synthesis and Component Assignment

| Function | Circuit Area (um$^2$) | Max. Circ. Freq. (MHz) | Min. Perf. (Mbps) | 0.25 mm$^2$ component | 1.0 mm$^2$ component | 4.0 mm$^2$ component |
|---|---|---|---|---|---|---|
| | | | | Valid Freq. Range (MHz) | | |
| Small Components | | | | | | |
| USB 1.1 PHYSICAL LAYER | 2,201 | 2941 | 12 | 2-2941 | No benefit | No benefit |
| VITERBI | 2,614 | 1961 | — | N/A-1961 | No benefit | No benefit |
| VGA/LCD CONTROLLER | 4,301 | 1219 | — | N/A-1046 | N/A-1219 | No benefit |
| WB DMA | 13,684 | 1163 | — | N/A-521 | N/A-1163 | No benefit |
| MEMORY CONTROLLER | 29,338 | 952 | — | N/A-843 | N/A-952 | No benefit |
| TRI MODE ETHERNET | 32,009 | 893 | 1000 | 125-893 | No benefit | No benefit |
| PCI BRIDGE | 76,905 | 1042 | — | N/A-610 | N/A-1042 | No benefit |
| WB SWITCH (8 master, 16 slave) | 81,073 | 1087 | — | N/A-88 | N/A-353 | N/A-1087 |
| FPU | 85,250 | 1515 | — | N/A-505 | N/A-1515 | No benefit |
| DES | 85,758 | 1370 | 1000 | 16-1203 | 16-1370 | No benefit |
| 16K SRAM (Singleport) | 195,360 | 2481 | — | N/A-2481 | No benefit | No benefit |
| AHO-CORASIK STR. MATCH | 201,553 | 2481 | — | N/A-1331 | N/A-2481 | No benefit |
| RISC CORE (NO FPU)/8K CACHE | 219,971 | 1087 | — | N/A-1087 | No benefit | No benefit |
| 8K SRAM (Dualport) | 230,580 | 1988 | — | N/A-1988 | No benefit | No benefit |
| Medium Components | | | | | | |
| TRIPLE DES | 294,075 | 1282 | 1000 | No space | 16-1282 | No benefit |
| FFT | 390,145 | 1220 | — | No space | N/A-1220 | No benefit |
| JPEG DECODER | 625,457 | 629 | — | No space | N/A-629 | No benefit |
| 64K SRAM (Singleport) | 682,336 | 2315 | — | No space | N/A-2315 | No benefit |
| 32K SRAM (Dualport) | 733,954 | 1842 | — | No space | N/A-1842 | No benefit |
| RISC CORE + 64K CACHE | 864,017 | 1087 | — | No space | N/A-1087 | No benefit |
| Large Components | | | | | | |
| 256K SRAM (Singleport) | 2,729,344 | 2315 | — | No space | No space | N/A-2315 |
| 128K SRAM (Dualport) | 2,935,817 | 2882 | — | No space | No space | N/A-2882 |
| RISC CORE + 256K CACHE | 3,111,025 | 1087 | — | No space | No space | N/A-1087 |

Goals and constraints on component size: The constrained I/O sets a lower-bound on feasible component size. Early VLSI engineers observed a phenomenon, now referred to as "Rent's rule." Rent's rule states that a circuit's required I/O is proportional to its area (IO∝Area$^\beta$). While the precise constants used in the rule change depending upon the type of circuit, the structure of the rule does not. Important for the purposes of this discussion, however, is that the I/O required by a block of circuitry grows at just above the square root of the area (previous work suggests that β=0.45 for processors and memory, and β=0.6 for less structured logic). Because the I/O available to a component grows linearly with its area, there must be some minimum component size, below which the component area will not be sufficient to support the I/O demands of the circuitry within the component.

Components will also have a maximum useful size. Rent's rule further indicates that beyond some component size, larger components will not be able to utilize all of the I/O available to them. Component designers should design components that use the available I/O, because it is this I/O that connects the fixed, inflexible component designs in unique ways to produce unique chip designs.

Finally, components can be offered in more than one size. The more component sizes that are offered, the better will the area and I/O offering of the components match the true area and I/O requirements of a specific circuit. If desired, the components can conform to "standard" sizes, because it can be difficult to interface arbitrarily-sized components with the communication capabilities that the polymorphic network provides.

Goals and constraints on component functionality: Many of the applications for which component and polymorphic network manufacturing might be used are those that currently employ traditional ASICs. For example, appropriate potential applications include wireless transceivers, media encoding/decoding, systems-on-chip (SoC) integrations, etc. In creating such chips, the functional blocks of the designs are fairly large and include, for example, FFT engines, JPEG compressors, and embedded microprocessors.

The preceding three points are quantitatively addressed below, based on synthesis data from candidate component functions.

Component size determination: To begin assembling a component family, freely available functional cores can be employed to produce a "benchmark suite." For example, starting with Verilog source code from OPENCORES.ORG and other sources of publicly available technology, designs can be compiled with the Synopsys DC Ultra design flow, targeting a 90 nm TSMC ASIC process. A commercial memory compiler was employed to generate optimized memory functional blocks.

Based on this data, and the constraints outlined above, it was determined that three component sizes are reasonable: small (0.25 mm$^2$), medium (1.0 mm$^2$), and large (4.0 mm$^2$). Table 1 (above) gives the specifications of the resulting component assignments. Each component size offers a fixed I/O bandwidth based on its area to the polymorphic network. In Table 1, these bandwidth limitations have been converted into bounds on the speed at which a component can be clocked. When present, the lower frequency bound indicates the minimum speed required to meet application requirements (e.g., an Ethernet device must process data at the line rate). One of two things bounds the top of the frequency range: (1) the speed at which the functional block can operate in a 90 nm TSMC standard cell process; or, (2) the amount of I/O bandwidth available for that component. Based on prior work, a data rate of 2.5 Gbps per pin is assumed.

The components can be organized according to their sizes. Functional blocks can then be assigned to the smallest component size that can meet the area and application bandwidth needs. Note that none of the medium and large components benefit from increasing the component size, indicating that none of them are I/O constrained, which is a direct effect of Rent's rule. The higher maximum clock frequency at a larger component size indicates, however, that five of the thirteen small components could take significant advantage of the increased I/O bandwidth that a larger component affords. In these cases, it is envisioned that component builders will do one of two things: (1) provide two different component sizes, with the smaller component supporting only lower frequency designs; or, (2) more likely, redesign the components to take advantage of the added area of a larger component. Although not investigated, one option would be to group blocks of similar functionality (e.g., an Ethernet and USB controller on the same "general purpose computing I/O" component). Another option is to tune buffer sizes on the design. For example, the Aho-Corasik string matching block can use additional buffer space to support more complex string matching patterns.

Background of the Polymorphic Network

The history of on-chip networks began with off-chip, large-scale system interconnects. This prior art used a variety of topologies, and among them are those discussed below, including: fat tree, butterfly, mesh and ring. Present and future multi-core designs demand much more than a simple integration of earlier large-scale system interconnects onto a single die. For example, while mapping meshes and rings onto a single chip is relatively easy, mapping a butterfly network presents more challenges. In addition, new topologies have arisen that are specifically designed for on-chip interconnects.

The switches that are connected to form these topologies have also been refined, to meet the stringent power, latency, and fault tolerance requirements of an on-chip network. The result is that today, a rich and expanding array of options is available when implementing an on-chip interconnect. Despite this array of choices, there is contemporary evidence that tailoring an interconnect to a particular workload can frequently and significantly improve performance.

There are a number of published techniques for determining the appropriate network design for a specific application. In 2006, research by another party presented evidence that non-uniform network input buffers offer significant network performance improvements. The work arising from this study presents a pre-fabrication, buffer allocation algorithm that can be applied to find the appropriate buffer size to improve performance and economize resources. Other researchers have developed tools to synthesize a custom network on a chip for a particular application. Each of these projects has demonstrated a significant improvement in performance when the interconnect was tailored to a particular application.

FPGAs already contain configurable networks. While the concept of "island style" routing and FPGAs have inspired the present work, the details and underlying purpose are entirely different. The performance (delay, power, area) of FPGAs is impacted by their design goals. The ability to configure routes on a per-bit level, means the overhead of FPGAs is quite high. Consequently, a long history of research into coarse-grained FPGAs exists. This work has reduced the overhead caused by bit-level configurability, but still provides interconnect structures geared towards fully statically routed designs, as would be required for emulating circuits. As will be evident from the discussion that follows, the relationship between the present polymorphic on-chip network architecture and an FPGA is only at a superficial level. In effect, a polymorphic network is a tailored configurable device designed for emulating on-chip networks, in the same way that an FPGA is a tailored configurable device designed for emulating circuits.

Functions Performed by Polymorphic Network (I/O Cap)

An initial exemplary embodiment of the network comprising the mortar in the "brick and mortar" concept, as well as a subsequently developed exemplary embodiment of a polymorphic network, are silicon components that provides four primary functions: (1) power for components; (2) clocks for the components; (3) I/O pads for connectivity to external package pins; and, (4) connectivity between components. The first three functions offer little in the way of component and network-specific architectural questions, so the following discussion focuses on the fourth function to drive the network design for the present novel approach. Within this function and with regard to the initial exemplary embodiment of the network or mortar, two key questions are as follows. Given an application space and component family, what is the best use of the limited number of communication pins into and out of a component? How does an engineer design a single network that functions with a variety of component sizes and offers the designer the ability to reconfigure interconnections between the components? To answer these questions, it is necessary to return to the synthesis data.

Figure 2A:
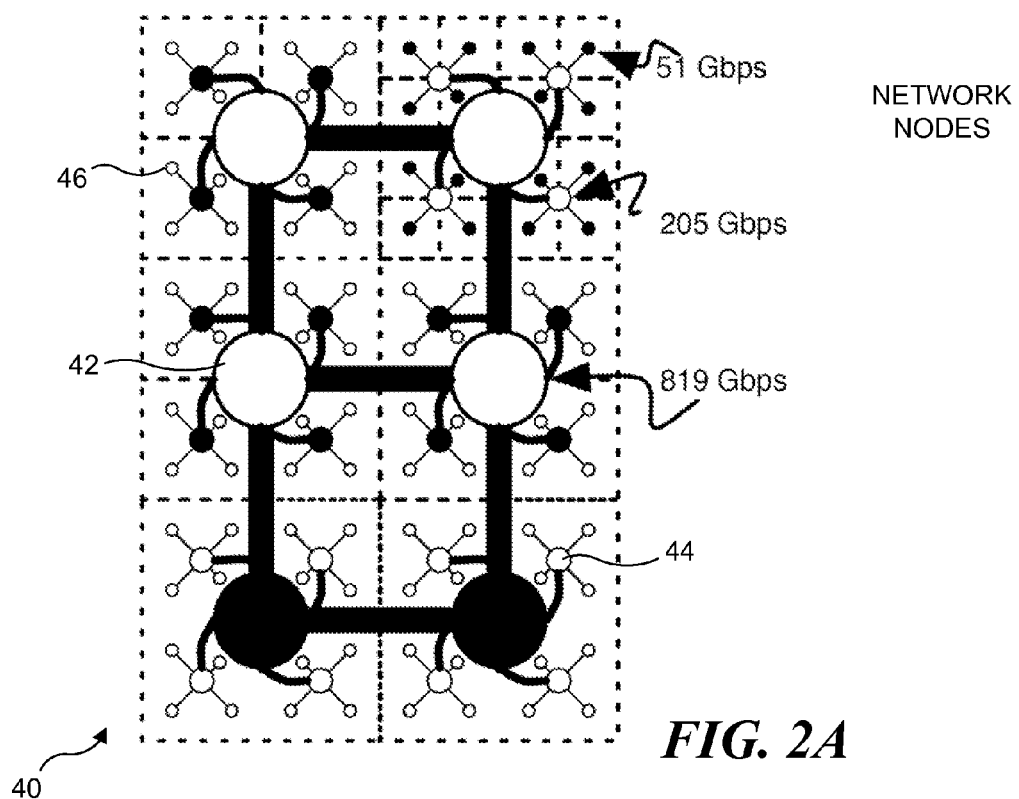
FIG. 2B is a schematic diagram indicating an alternative exemplary embodiment of a first inter-brick interconnect for an island-style, statically programmable, mesh interconnect through which pins can be electrically tied directly to one another, and which can be used to tightly couple a fixed set of bricks (i.e., pre-fabricated components) in communication with each other.
Figure 2B:
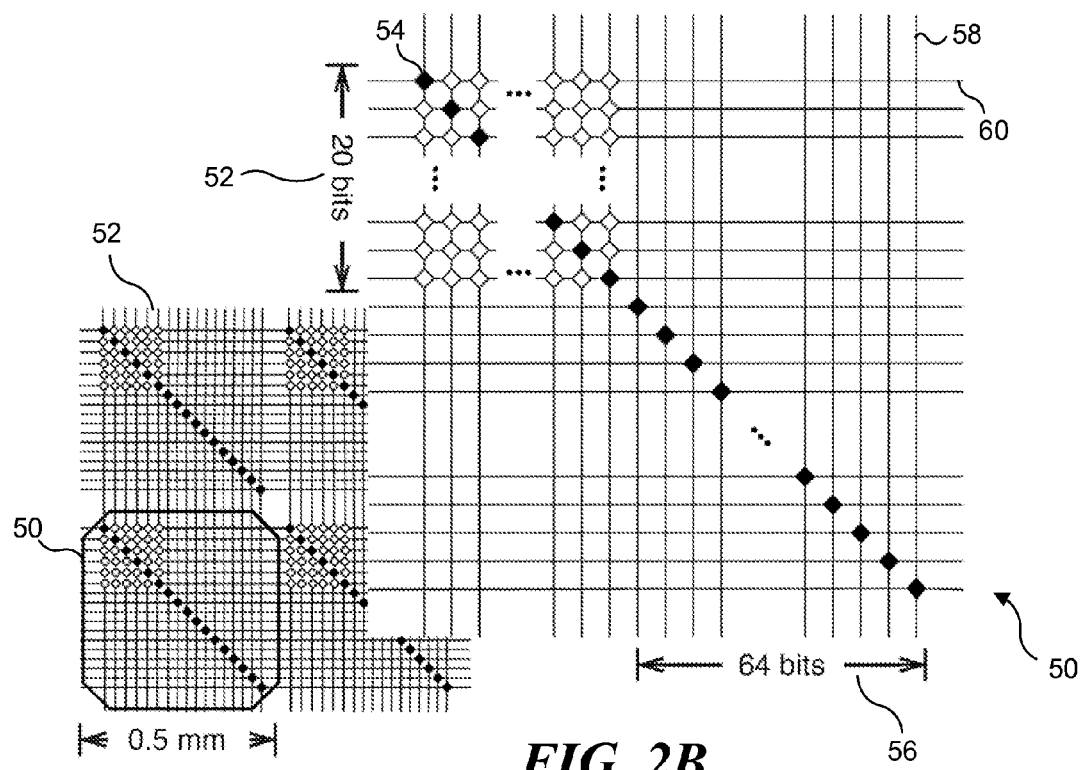

Because the components come in three sizes in the exemplary embodiment discussed herein, and because the particular arrangement of components will vary on a per chip basis, the interconnect in the network must be both multigranular and flexible. Two exemplary types of networks 40 and 50 were implemented, as illustrated in FIGS. 2A and 2B, respectively.

Packet-switched interconnect: A first exemplary network 40 is configured as a dynamically switched packet network. FIG. 2A shows a portion of an exemplary component layout for this network, with the logical packet-switched network topology in the network that is overlaid with components. Each of larger circles 42 represents a network node that can operate at up to 819 Gbps. Also shown are medium size circles 44 representing nodes that can operate at up to 205 Gbps, and small size circles 46 representing nodes that can operate at up to 51 Gbps. The solid black nodes, such as the two larger circles at the bottom of the illustration, indicate leaf nodes, which are valid packet destinations. The nodes represent routers in this exemplary interconnect scheme. The interconnect scheme is a fat-tree within each 4 $mm^2$ of silicon (indicated by the area within the dotted lines), and then, a grid at the top-most level. A 64-bit packet implementation of this network was coded and synthesized using Synopsys DC Ultra™. The synthesis result indicated that this network could operate at 800 Mhz, with one cycle per hop, and would consume 43% of the network area. The bisection bandwidth of this network is 3.3 Tbps for a 64 $mm^2$ die.

FPGA-style Interconnect Fabric: The second exemplary interconnect option is an island-style reconfigurable interconnect 50, shown in FIG. 2B, over which pins in the network are programmatically connected. Just as with an FPGA, the connecting wires are routed through this mesh. Since wires are constrained at the component-to-network interface, the same physical wires are used as in the packet network of FIG. 2A, and they can be multiplexed between the two dynamically.

As with the packet-switched network, a configurable single-bit wiring node was synthesized. Area results from DC Ultra indicate that such a node requires 155 square microns. Leaving area for remaining logic on the network (power distribution, clock, pad drivers, etc.), it is estimated that there is room for approximately 500 switches 54 per each small component. Of these switches, 400 are devoted to a 20 by 20 fully configurable mesh 52, and another 64 switches 56 are used for a partially configurable mesh, as illustrated in the example shown in FIG. 2B. The benefit of this approach is that by enforcing a small amount of standardization on the pin interface, components can utilize the mesh to route large 64-bit items to their neighbors by selectively interconnecting wires 58 with wires 60. Some flexibility is retained with the 20 fully configurable routes. The bisection bandwidth of this network is 0.26 Tbps (fully switchable) and 0.8 Tbps (partially configurable). While the packet-switched network is most useful for routing data between dynamically changing sources and destinations, this mesh is better suited to tightly coupling two components, particularly two that are physically near one another. This approach is used as described below, to bind a floating point unit (FPU) to a central processing unit (CPU) for one exemplary CMP configuration.

TABLE 2

CMP Configurations

| | Chip Multiprocessor Designs | | | | | |
|---|---|---|---|---|---|---|
| | CMP-L | | CMP-M | | CMP-S | |
| Total Area ($mm^2$) | 193.5 | | 177.5 | | 200.5 | |
| | Chip Composition | | | | | |
| | Count | % Area | Count | % Area | Count | % Area |
| | Small Components (.5 × .5 mm) | | | | | |
| RISC CORE (NO FPU) + 8K CACHE | — | N/A | — | N/A | 16 | 1.99% |
| FPU | — | N/A | — | N/A | 16 | 1.99% |
| ETHERNET NIC | 1 | 0.13% | 1 | 0.14% | 1 | 0.12% |
| MEM CNTL | 1 | 0.13% | 1 | 0.14% | 1 | 0.12% |
| USB PHYS LAYER | 1 | 0.13% | 1 | 0.14% | 1 | 0.12% |
| DMA | 1 | 0.13% | 1 | 0.14% | 1 | 0.12% |
| PCI BRIDGE | 1 | 0.13% | 1 | 0.14% | 1 | 0.12% |
| VGA/LCD CNTL | 1 | 0.13% | 1 | 0.14% | 1 | 0.12% |
| | Medium Components (1 × 1 mm) | | | | | |
| RISC CORE + 64K CACHE | — | N/A | 16 | 9.01% | — | N/A |

TABLE 2-continued

CMP Configurations

Large Components (2 × 2 mm)

| | | | | | | |
|---|---|---|---|---|---|---|
| RISC CORE + 256K CACHE | 16 | 33.07% | — | N/A | — | N/A |
| 256K SRAM | 32 | 66.15% | 40 | 90.14% | 48 | 95.29% |

Simics/GEMS Performance Simulation

| | Component & network ASIC | | Component & network ASIC | | Component & network ASIC | |
|---|---|---|---|---|---|---|
| Number of Cores | 16 | 16 | 16 | 16 | 16 | 16 |
| L1 Cache/Core (KB) | 256 | 256 | 128 | 128 | 8 | 8 |
| L2 Cache Size (MB) | 8 | 8 | 10 | 10 | 12 | 12 |
| L2 Associativity | 4 | 4 | 5 | 5 | 6 | 6 |
| L2 Block Size (B) | 64 | 64 | 64 | 64 | 64 | 64 |
| L2 Set Size (KB) | 32 | 32 | 32 | 32 | 32 | 32 |
| Processor Cycles to L2 | 31 | 22 | 41 | 22 | 50 | 22 |
| Exe. Time (Avg.) | 108% | 100% | 120% | 100% | 136% | 100% |

Table 2 (above) describes three CMP configurations used in the study, which focused on building CMPs from three different size RISC core components. CMP-L features high integration with a large component combining a processor and an L1 cache. CMP-M integrates a much smaller L1 cache onto a medium component with the processor, while CMP-S offers only 8 KB of L1 cache with the processor on a small component.

Methodology

CMP simulator: To understand the performance impact of component and configurable network assembly on a CMP design, the Virtutech Simics™ simulation framework and GEMS™ tool set were used. The exact configurations for the CMP designs are specified above in Table 2, and the Splash2 suite was employed for multithreaded benchmarks.

PoI Model: To gauge the performance of the mortar or network, a simulation model of the synthesized network from the above section was developed. The latency information from this model was used to provide appropriate interconnect delays to Simics for the CMP.

Process Variation Model: The effect of process variation on component performance was modeled using the FMAX model. In this use of this model, it is assumed that as die size increases, the number of critical paths increases, which leads to an overall increase in the mean delay, and a decrease in the standard deviation of that delay.

Made-to-Order Chip Multiprocessors (CMPs)

Large customers of computing systems recognize that their application requirements do not always match the one-size-fits all processors available today. For example, network servers need throughput on task-based parallelism, while scientific computing requires extensive floating point capabilities. Thanks to the low overhead associated with starting and producing a run of chips with component and network assembly, it is possible to produce made-to-order CMPs. For this work, a basic CMP design was selected, and the costs and benefits of fabricating it using component and network were examined.

Three different 16-way CMPs were examined, built out of the components discussed above, which fit within 200 mm$^2$. Each design included 16 combined processor and L1 cache components. These components differ in size (small, medium, and large), cache capacity (6 KB, 64 KB, and 256 KB), and whether the FPU is on the same component. After some general-purpose I/O components, the L2 cache fills out the remainder of the 200 mm$^2$ area budget. Table 2 summarizes the designs.

Performance: Across the three designs studied, three significant factors change. First, the L1 caches are constrained by the choice of component size to implement the processor. Second, the network delay between the L1 and L2 depends on component layout. Third, the CMP built from smallest RISC core components (CMP-S) requires an additional FPU component per processor. The processor and FPU are connected using the mesh interconnect.

For each component and network design, a corresponding, equally-provisioned ASIC version of the CMP was modeled for comparison. The primary difference between the ASIC and present novel approach using component and network designs is the component latencies. The component and network inter-component latencies come from the network model, while the ASIC latencies come from the published latencies of the UltraSparc T1 on-chip interconnect. The "Simics/GEMS Performance Simulation" section of Table 2 gives the specifics of each pair-wise comparison.

Figure 3:
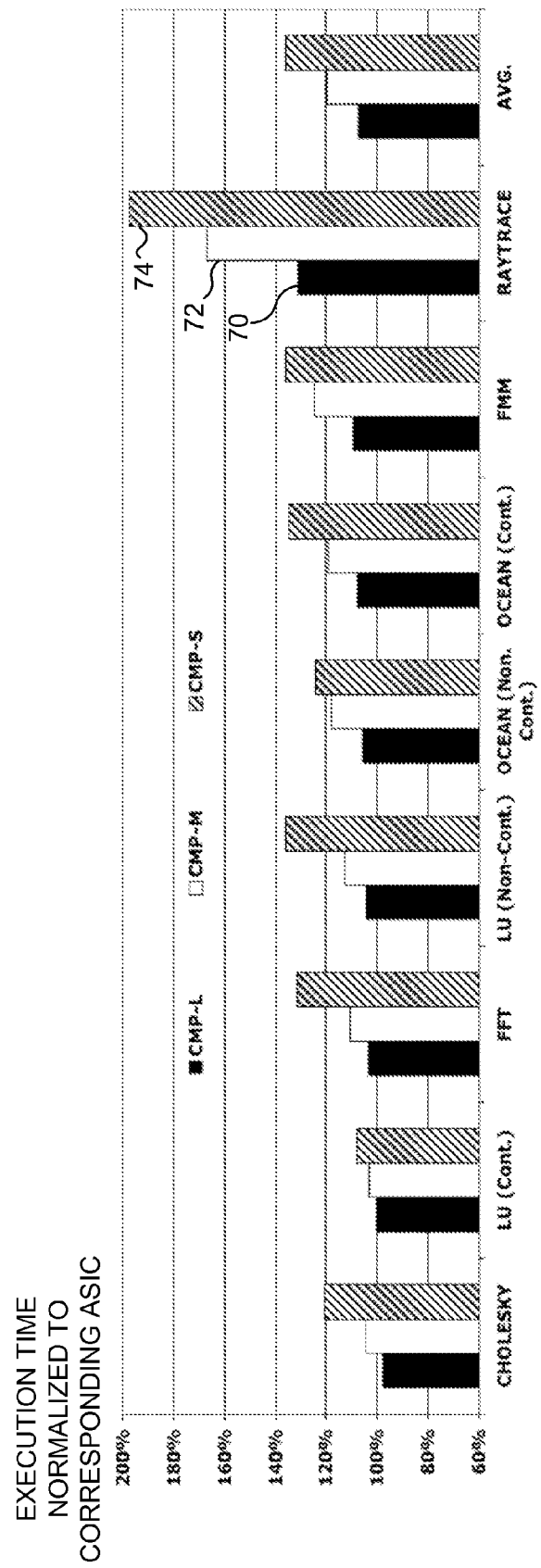
FIG. 3 is a graph showing the execution time of multi-threaded Splash2 workloads running on a CMP relative to the execution time on an equally-provisioned ASIC CMP, it being noted that the larger the L1 cache in the CMP design is, the less L2 traffic arises, resulting in less inter-component communication, and thus, less slowdown relative to an ASIC.

FIG. 3 shows the performance results from the simulations. The performance of each component and network chip was normalized to the performance of the corresponding ASIC design. On average, the benchmarks took 8%, 20%, and 36% more time to complete on the three component and network CMPs than on the corresponding ASICs. This result was due to the increased interconnect latency that the network introduces. The primary difference between the three CMP designs was in the size of the L1 cache in the processor component. Naturally, the smallest 74 (8 KB cache in CMP-S) incurred the most L1 misses, and the largest 70 (256 KB cache in CMP-L) incurred the fewest, with the results for CMP-M falling between those for the other two designs. Each L1 miss sends a request to the L2, which on the component and network designs required communication via the network. Thus, the L1 miss rate in the component and network CMP designs determined ultimate performance.

Exploiting Process Variation: To understand how process variation affects component and network chip performance, the variation model was used to characterize the critical path delay for each component size. The results are depicted by three leftmost dash line curves 80, 82, and 84 in FIG. 4. The data are scaled to an average critical path delay of 1.0 and show the distribution of maximum critical path length for each component. This model was also used to calculate an expected distribution of maximum critical path delay 86 in a 200 mm² ASIC chip. Because a smaller chip (such as a component) has fewer critical paths, the longest critical path is likely to be shorter than the longest critical path on a larger chip (such as the 200 mm² ASIC). However, when 200 mm² worth of small components are assembled (as in CMP-L), the result (shown by dash line curve 88) is the same distribution of worst case critical paths as a monolithic 200 mm² circuit.

The novel component and network approach disclosed herein affords a unique opportunity to pre-select components based on their process variation characteristics prior to production. There will be some natural variation in each component produced. With the component and network approach, it is possible for the chip designer to "cherry pick" the high-performance components and build a chip entirely out of them. This methodology is similar to how Seymour Cray separated the high- and low-performing gates when he built the Cray-1™ computer.

Experiments were made with speed-binning the components prior to assembly, by binning them into 1 (no binning), 2, 4, and 8 speed grades. The resulting variation in component and network chips is plotted in solid curves 90, 94, 98, and 102, and the result for the 200 mm² ASIC are indicated by dash lines 92, 96, 100, and 104, all as shown in FIG. 5. Note that with only two speed bins (second from top graph), the number of high performance chips is significantly improved (the spike on the left). The reason this result occurs is that the speed of the chip is set by the component with the longest delay. By speed grading components prior to assembly, it is possible to focus on building high-performance chips from high-performance components. Without speed grading, since a chip can easily contain 10's of components (54 total for CMP-L), a low performing component often slips onto the design and constrains the entire chip's performance. Speed grading in this way brings further improvements in high-performance chip production as the number of grades or bins is increased.

Manufacturing Component and Network Chips

The discussion above described the basic structure of a component and network chip, namely ASIC components bonded to a network that serves as the mortar. What has not yet been described is how components are arranged into an application-specific design prior to bonding to the network. A straightforward approach is to use robotic assembly. Manipulating and aligning devices at the ≈1 µm scale that is required for component and network assembly is a solved mechanical engineering problem, and commercial systems exist for manipulating devices at this scale. A substantial drawback of these devices is their cost. Robotic solutions would be suitable for low-volume manufacturing; however, for larger volume manufacturing, a lower-cost alternative is preferable. Fortunately, there is such an alternative.

Components for component and network chips can also be assembled using fluidic self-assembly (FSA). As shown by step-by-step illustrations 110 in FIG. 6, FSA begins with one assembly template 112, 114, and 116, per component sizes small, medium, and large, respectively. Components 120 of the three sizes 24, 26, and 28 are placed loosely and randomly onto this substrate in mass, using the appropriate template for the size components being assembled. The substrate is then agitated (shaken) on a shaker table 118, causing the components to move around. The assembly substrate is pitted with component-sized holes into which the components fall as they move about. Eventually all holes on the substrate will fill, completing the arrangement of components. An adhesive lifting sheet 122 is then used to lift the components off the templates, which can then be washed and reused. The components on the adhesive plate are flip-chip bonded to a network substrate 124 and the adhesive lifting sheet is pulled away and discarded. A customized semiconductor chip 126 is thus produced by this technique. Previous work has demonstrated the efficacy of this technique using devices of approximately the same size as those for the components, as noted above.

To assemble a component and network chip with FSA, several other techniques can be employed. First, the assembly template is an active silicon device. To reduce cost, it is preferable to design a template that can be used in manufacturing a variety of chips, i.e., one that is not application-specific. Second, the architectural study presented above indicates that multiple sizes of components are useful to match the area and bandwidth offerings of a component to the area and bandwidth demands with the functional logic it contains. Unfortunately, a single FSA process cannot assemble components of differing sizes, because different component sizes require different agitation forces. Simply running at the maximum agitation force will work fine for the larger components, but the small components will never settle onto the substrate. This drawback means that the assembly process would require one (or more) separate FSA substrates per component size. The final technique is to assemble components of the same size, but different functionality together. To make this approach work properly, however, a way is needed to control the bonding of a particular component type to a particular site on the assembly substrate.

Component modification: The basic architecture of a component can be modified to include a simple AC coupled power and communication device that is capable of sending back a unique identification tag, which can then be used by the substrate to identify the type of component in each slot. This technology is well-established and in wide use in RFID tags. A simple version is suitable for this purpose, since the communication of the identification tag need travel only a few micrometers, instead of a few feet.

Template Assembly: The specific FSA process on which the experiments were based is a semi-dry one. In this process, components of the same size are mixed with a small amount of water and poured over an assembly substrate with correspondingly-sized bonding sites. Parts arrive at binding sites by random motion, thanks to the shaking of the substrate. When a component nears a binding site, there are three forces that determine how it falls into the site. First, components are not pure squares, but rather shaped such that they can fit into binding sites only when aligned properly. Second, they fall due to gravity. Third, capillary forces assist gravity. This sort of capillary force-driven self-assembly relies on the minimization of interfacial energy. The substrate on which components are being assembled in this exemplary embodiment is coated with a polymer pNIPAM (poly-Nisopropylacrylamide), which can reversibly switch between hydrophobic and hydrophilic states, allowing components to be attracted to or repelled from the assembly surface. During assembly, the substrate functions as an active silicon die. As components fall into binding sites, the substrate queries the component, using the AC-coupled communication device, to determine the component's type. The substrate can then reject components that fall into the wrong location by setting the polymer's state to hydrophobic through a small change in the local temperature of the binding site.

Composite assembly: Once a complete template of same-size components has been formed, it can be robotically lifted off the substrate with lifting sheet 122 and placed onto network substrate 124 (see FIG. 6). It is necessary to perform this step once for each size component used in the design. It is also possible to perform this step more than once for each size component, if so desired. The following discussion outlines circumstances under which this latter approach would be desirable. This process might not completely eliminate the need for high-precision robotic assembly, since this last, composite assembly step may require a mechanical device. However, the process can replace the majority of the work, i.e., component assembly, with the low-tech and inexpensive FSA processes.

Interplay of Architecture and Fluidic Self-Assembly

An interesting fact of component and network manufacturing is that there is an extremely close interplay between what is being manufactured and how the manufacturing is performed. This section explores how the architecture of the chip affects and can be affected by the FSA process. To carry out this study, a simulator was utilized for the FSA process itself This simulator was built to match production capabilities of previous experimental FSA work. It models component assembling onto the substrate, where the components are programmatically discarded if they are the wrong type, and can be accidentally discarded (a feature of the FSA process that happens 5% as often as components attaching to sites in a well-tuned system). For this study, synthetic chip designs were utilized to examine assembly times as the number of components and number of kinds of components in a design varied. The number of kinds of components was varied from 1 to 5, as well as the number of components in the design. Data 130 in FIG. 7 show that increasing the number of kinds of components (their heterogeneity) or the number of components required increases the assembly time exponentially. This result means that there are strategic decisions to be made at each stage of the process, from component architecture, to chip architecture, in regard to how to make use of the assembly process to control assembly time. In the sections that follow, the trade-offs in these decisions are explored.

Component design: The data in FIG. 7 indicate that assembly time grows exponentially with the number of kinds of components present in an FSA process. When faced with the option of utilizing two different component types with largely similar functionality or a single, slightly reconfigurable component, significant gains in assembly time can be achieved by introducing the single reconfigurable component. Examples of component functions where this might be possible include byte- vs. word-aligned memories and bus interface standards.

Interconnect design: Another interesting interaction between architecture and manufacturing is in the placement of components. Specifically, if architectures can be designed where the placement of components need not be exactly the same for every chip produced, the assembly time will shorten dramatically. Data 140 in FIG. 8 indicate that by relaxing the constraints on component placement, the assembly process will complete significantly more quickly. When relaxing placement constraints, the grid of components is carved up into square regions of slackRadius components on a side. Within each of these regions, a component that falls anywhere within the region can satisfy any of the components required by that region (provided a component of that type was indeed required by the region). So, a 1×1 region (slackRadius=1) represents strict component placement requirements.

Note that the solid lines in FIGS. 7 and 8 are identical. The 25-component line in FIG. 7 is the same as the slackRadius=1 line in FIG. 8, because the data in FIG. 8 were collected using 25-component designs, and the data in FIG. 7 with slackRadius=1. This result implies that approximately the same amount of time can be saved by introducing a slackRadius of a 5- to a 25-component chip (FIG. 8) as by reducing the size of the design from 25 to 9 components (FIG. 7).

In order to accelerate the assembly process in this way, the communication interconnect must be sufficiently general or programmable to handle the unpredictability in placement. If placement slack is allowed, a single chip design could result in a different component layout for each chip that is assembled. Therefore, the interconnect must be flexible not only on a per-design basis, but also on a per-chip basis. It is up to the chip designer to determine how much slack to introduce, and the decision should be based on the tradeoffs between assembly time, desired performance, and the latency tolerance of the design itself.

Assembly management: Thus far, an exemplary component and network assembly process has been described using different FSA stations to assemble components of the same size. These partial-chip assemblies are then robotically assembled onto a network. However, nothing constrains the use of multiple templates to be used only for different size components. The process should be viewed more as: given a number of template assembly stations, what mix of components should each station assemble?

One way to utilize multiple assembly stations is to spread the heterogeneity of the desired components across a range of component sizes. For example, if a design requires 12 different kinds of components, a design consisting of 12 kinds of large components will assemble significantly more slowly than a design consisting of 4 small, 4 medium, and 4 large components. The type of chip being designed can determine how much flexibility the designer has in this respect. For example, not all kinds of components are likely to have small, medium, and large versions. For those components where that option is available, for example with the memory components discussed above, the chip designer may still need to decide how much to adjust the design, perhaps sacrificing some performance, in order to optimize assembly time.

Taken to the limit, the data in FIG. 7 indicate that, in theory, one should use a separate self-assembly process for each component type. In practice, that approach would require one assembly substrate per component type, which might not be feasible, since it essentially requires purchasing sufficient equipment for the most heterogeneous chip design likely to be made. Instead, it may be preferable to conserve equipment and either: (1) assemble two component types (of the same size) at the same time on the same template; or, (2) assemble the two component types in sequence, first the first component type, then the second, on the same table. The data in FIG. 7 indicate that the second option will result in faster assembly, but will likely require additional robotic support.

Inexpensive Fabrication Techniques and Fluidic Self-Assembly: Self-assembly has been studied extensively for years. It's promise has always been a low-cost alternative for bulk manufacturing that would otherwise require robotic assembly. Only one commercial company, Alien Technologies, is known to have attempted to employ FSA. Alien Technologies intended to use FSA to bond an antenna to a processing device for RFID tag production. To make FSA commercially viable, the integration of architectural and manufacturing decisions is required, as noted above.

Consideration of Network on Chip Designs

To explore a wide range of network on chip (NoC) designs, network parameters, such as queue capacities and packet sizes were varied. In addition, the policies and structures of the network, via the topology and arbitration algorithm were varied. The topologies were selected to cover a range of degrees of connectivity—from the highly connected fat tree, to the less connected ring—and because they belong to several widely-used topology families. For each topology, a deterministic, minimal, oblivious source routing algorithm was used. The design space includes two buffered arbitration policies: store-and-forward and wormhole, which reserves and preserves a connection at each switch until all packets in a message have traversed the switch.

A network is defined by its topology, routing algorithm, and arbitration policy. Within this definition, however, the performance of a network can vary a great deal based on its resources. Thus, a range of queue capacities and packet sizes were also included in the design space.

Cycle-level Simulation: The performance of each NoC in the design space was measured using a microarchitectural network simulator. The simulator is execution-driven and models the network on a cycle-by-cycle basis. This simulator was validated by successfully reproducing data from prior art. Three synthetic workloads were used to drive the simulations. The first of these, uniform random traffic, is a widely used traffic generation pattern, in which each node generates a message in each cycle for another randomly chosen node. This workload has similar traffic characteristics to an application that has near-random data accesses running on a CMP, for example a breadth first graph traversal. For this workload, and the others used in this study, the packets are injected via a Bernoulli process.

The other two workloads are permutation workloads, in which each node sends packets to exactly one other node, which is sometimes called an adversarial pattern because, unlike in the uniform random pattern, the communication load is unbalanced. The study experimented with two workloads in this family: random adversarial, in which the permutation of sender to receiver nodes is randomly generated, and local adversarial, in which each sender sends packets to a nearby receiver. The local adversarial pattern reasonably approximates a system-on-chip design in which the designer took care to place communicating blocks near to one another to maximally exploit any locality in the application.

Area Model: As on-chip interconnects are often designed under tight area budgets, it is unrealistic to explore interconnection options on the basis of performance alone. Thus, an analytical area model was developed for a network design. To balance model accuracy with design space size, designs were synthesized for the base network components, including buffers, queues and crossbars. These base estimates target a 90 nm process, using high-performance GT standard cell libraries from Taiwan Semiconductor Manufacturing Company (TSMC) for memories, and models for full-custom layout of crossbar interconnects.

Table 3 (below) describes the model in more detail. The inputs to the model in the first section of the table are the parameter settings that define a particular network design. The synthesis-based section of the table specifies the base area components, including queue and crossbar areas. The areas of the base components are then analytically combined to estimate the total network circuit area. Because networks are wiring-heavy circuits, a 20% wiring overhead was conservatively assumed in the cell placement, in addition to the already-accounted-for crossbar.

Design Space Exploration Results for Conventional Fixed Function Networks

Fixed Area Budget: Previous work has allocated a remarkably consistent 15% of die area to on-chip interconnects. These estimates span a wide range of process technologies, from 130 nm all the way down to 32 nm, and core counts, from eight to sixty-four core designs. In the study, 15% of a 15×15 mm die (225 mm$^2$) was allocated to the interconnect to investigate the performance tradeoffs in network latency and throughput.

TABLE 3

NoC Design Space and Area Model

Network Design Space Parameters

| Description | Symbol | Range |
|---|---|---|
| Number of Terminals | N | 16, 64, 256, 1024 |
| Topology | T | ring<br>mesh<br>butterfly ( = 2)<br>fat tree (k = 2, levels = 3) |
| Routing Algorithm | R | deterministic |
| Arbitration Algorithm | A | store-and-forward, wormhole |
| Message Size | M | 256 |
| Packet Size | P | 32, 64, 128 |
| Switch Packet Queue | SQ | 4, 16, 64 |
| Converter Message Queue Capacity | CPQ | 4, 16, 64 |
| Converter Message Queue Capacity | CMQ | 4 |

Synthesis-Analytical Area Model

| Description | Symbol | Value |
|---|---|---|
| Synthesis | | |
| Queue Area | Queue$_{area}$ | 0.00002 mm$^2$/bit |
| Wire Pitch | X | 0.00024 mm |
| Crossbar area | SB$_{area}$ | X$^2$ × D$_{in}$ × D$_{out}$ × P |
| Wire overhead | W$_{area}$ | 20% |

TABLE 3-continued

NoC Design Space and Area Model

| | | | |
|---|---|---|---|
| Number of Switches | S | $\begin{cases} N & \text{if T is ring} \\ N & \text{if T is mesh} \\ \frac{N}{2} \times \log(N) & \text{if T is butterfly} \\ N + \frac{N}{k^2} + \frac{N}{k^4} & \text{if T is fat tree} \end{cases}$ | |
| Analytical Switch Degree | D | $\begin{cases} 3 & \text{if T is ring} \\ 4 & \text{if T is mesh} \\ k & \text{if T is butterfly} \\ \begin{cases} 2 & \text{if leaf} \\ k^2 + 1 & \text{if internal} \\ k^2 + 4 & \text{if root} \end{cases} & \text{if T is fat tree} \end{cases}$ | |
| Switch Queue Area | $SQ_{area}$ | $SQ \times P \times Queue_{area}$ | |
| Switch Area | $S_{area}$ | $SQueue_{area} \times D + XBar_{area} + S\ Queue_{area} \times D$ | |
| Conv. Msg. Queue Area | $CMQ_{area}$ | $CMQ \times QPB$ | |
| Conv. Packet Queue Area | $CPQ_{area}$ | $CPQ \times QPB$ | |
| Converter Area | $C_{area}$ | $2 \times CMQ_{area} + 2 \times CPQ_{area}$ | |
| Network Comp. Area | $N_{area}$ | $S \times S_{area} + N \times C_{area}$ | |
| Total Network Area | $I_{area}$ | $1.2 \times N_{area}$ | |

The study examined the design tradeoffs when implementing a conventional network for a single traffic pattern. For example, it was determined that the pareto optimal network designs for uniform random traffic include all four topologies. The fat tree and mesh offer the lowest latency optimal designs, followed by the butterfly with double the latency, and lastly by the ring with quadruple. Over these optimal designs, increases in throughput come only with accompanying increases in latency. With both the fat tree and mesh, short queues of four entries, and large, 128-bit packets give rise to the aggregate optimal performance. At the other end of the spectrum, the ring, when provisioned with the same large packets, has a long transmission latency, but offers significantly higher throughput.

In the case of random adversarial traffic, the study indicated that fat tree once again offers the lowest-latency communication option. As with uniform random communication, some communicating nodes are going to be at a distance in the network, and thus, the non-neighbor connections proffered by the higher levels of the tree speed that traversal. The differences in throughput amongst the fat tree designs on this workload are entirely attributable to packet size: the larger the packet, the higher the throughput. This result is plausible under the area budget, because the network does not require particularly deep queues on this workload. The same is true of the mesh network, for which the best designs incorporate the large, 128-bit packets and short, 4-entry queues to maximize throughput under the area budget. However, on average, the packet latency through the mesh is slightly higher due to the neighbor-only links in the mesh.

In contrast, the local adversarial traffic experiences exactly the opposite result. While random traffic latency suffered on neighbor-only topologies, the local adversarial traffic, which is neighbor-only, took good advantage of those topologies. Thus, for this workload, the mesh topologies are optimal, with the ring not far behind.

While there is a network to fit each workload, there is no network that is optimal for all workloads. The optimal designs can differ in topology, and even when the topologies are the same, the resource provisioning is very different. Although these workloads are synthetic, it would not be farfetched to encounter three similar patterns in a single multi-core device, depending on the application or input data set that is running. Thus, in selecting a conventional network, a designer will necessarily have to sacrifice performance on one or more applications. It is this limitation of conventional network designs that is well addressed by the reconfigurability of the polymorphic network in the present novel approach, as discussed below.

Polymorphic On-Chip Network Architecture

The discussion above empirically motivated the fact that no single fixed-design on-chip network efficiently communicates different styles of traffic. In this section, further details of a polymorphic on-chip network are discussed. The polymorphic network is a further development of the "brick and mortar" architecture discussed above. Generally, the above discussion of the network that comprises the mortar in this novel concept is equally applicable to the polymorphic network. Components can be assembled on the polymorphic network and bonded to it, just as discussed above, or one or more components can be integral formed in the same die as the polymorphic network rather than separately added to it. It is important to understand that the polymorphic network can be configured (and reconfigured) after fabrication, prior to application runtime to mimic traditional fixed function networks. This capability to reconfigure interconnections within the polymorphic network gives it a unique capability that has not previously been provided, and this capability represents a step beyond the component and network (i.e., the "brick and mortar" approach) that is discussed above.

One exemplary embodiment of a polymorphic network 150 that is shown in FIG. 9 comprises buffer regions 152 and crossbars 154. Terminals or pads 159 are provided for input and output nodes and can serve as electrical interfaces for coupling to one or more electronic components supported by the polymorphic network.

Alternatively, in a very different configuration, instead of being used for connecting to separate discrete electronic components, the blocks that represent terminals 159 can instead represent functional components (or I/O ports of a single functional component) that are included in the semiconductor die used for the polymorphic network. For example, a plurality of processors can be included as functional components in the semiconductor die, along with the polymorphic network, and the polymorphic network can be employed to configure or reconfigure interconnections between ports of the plurality of processors, as well as any other functional components that are also part of this single die. Many other types of functional components can be beneficially employed in the same die as the polymorphic network. The interconnect reconfigurability of the polymorphic network provides a substantial benefit over fixed interconnection schemes for altering the operating characteristics of such a multi-functional component semiconductor chip.

Careful design allows runtime configuration of the resources comprising the polymorphic network, to form interconnects with custom topologies, buffer allocations, and packet sizes. The microarchitecture of the configurable fabric is described below, followed by some examples of how to take advantage of the polymorphism provided by the polymorphic network.

The exemplary polymorphic network switch, as with a classic switch, includes input packet queues, routers, arbiters, and crossbars of connections. A "slice" 156 includes an input queue 153, a router 158, an arbiter 160, broadcast conductors 157 (used for conveying data along a route, the next step of which is determined by the router), and configurable data connections 162. Also included is a multiplexer 155 that selects one of the outputs for input to the input queue of another slice. These slices are clustered into regions 152. FIG. 9 illustrates eight slices 156 per region; however, the following discussion explores different configurations of this underlying fabric structure.

The crossbar (not identified by a reference number in FIG. 9) connecting the slices in a region is a double crossbar that allows redefinition of the input connections as well as the usual dynamic definition of output connections. Small diamonds indicating configurable data connections 162 on the packet input line in the slice detail in FIG. 9 denote this capability. Although FIG. 9 shows these crossbars as bidirectional, each crossbar includes two single directional wires (or conductors) that convey signals in opposite directions, because drive buffers can be employed only on directed wires. In this example, single directional wires 166a and 166b extend in the vertical direction, and single directional wires 168a and 168b extend in the horizontal direction. Dual wire pairs also couple crossbars 154 to regions 152. Furthermore, the physical crossbars in this example are segmentable, with a potential segment point between each of the slices. Selectively actuatable switches 164 can be opened to segment any of these wires and other such switches can be activated to couple a specific wire running in the horizontal direction to a specific wire running in the vertical direction. A one bit memory register (not separately shown) is provided for each of the switches, and this memory register in each switch 164 is separately addressable, so that a "0" or "1" can be loaded into the memory register to respectively select the open or closed state of that switch. The configuration data that are provided to achieve a desired interconnection and data flow scheme in the polymorphic network includes the bits that are loaded into the memory registers of specific switches 164. The data loaded into the memory register provided for each switch can be readily modified up to the time that an application is run that employs a selectively customizable chip using polymorphic network 150.

The configurable connection between input wires and crossbars, and the ability to segment a crossbar make it easier to construct switches out of slices from different regions in the fabric. This ability to aggregate slices from different regions into one logical switch turns out to be very valuable, as it allows for a dense packing of switches, which has two benefits. First, as the input and output queues consume most of the area of this fabric, it is important to waste as few queues as possible when configuring the network. Second, the closer the switches are physically disposed to each other, the shorter the routed links that connect them must be, leading to less link routing congestion and less capacitive load on those links.

Routing and arbitration: Each network slice contains routing and arbitration logic. These two pieces of logic serve the same function as the router and arbiter in their classic or conventional switch counterparts. Router 158 is associated with an input queue, and determines to which output the first packet in the queue should be routed. Meanwhile, each output queue has an associated arbiter 160 that grants one input at a time access to the output queue.

In some exemplary embodiments of the polymorphic network, source routing is used, where each packet carries its pre-computed route with it, rather than making routing decision at each point in the network. This approach enables the network to support any static routing scheme, such as the ones explored in the earlier design space exploration. However, the effect of the pre-computed route is that it adds bits to the packet header, reducing the payload of a fixed-size packet. One way to avoid this problem, and the one currently used in other embodiments, is to implement wormhole arbitration, enabling a lead packet to carry the route and establish necessary connections, that will be used by the subsequent packets belonging to the same message.

Configurable link resources: Surrounding the regions are configurable link tracks which support configurably routed links between the switches. Unlike the crossbar connections between the slices, the connections in these crossbars are statically configurable. They will implement one fixed topology per configuration.

Virtual channels: Each slice supports two virtual channels, which can share the available buffer space, using a flexible sharing scheme. Networks requiring more than two channels must aggregate multiple slices together.

Interface to cores: The polymorphic network fabric will be connected to cores in much the same way as a normal network on chip would. A region is specialized further such that certain fixed input/output nodes are directed not to general purpose first-in-first-out (FIFO) nodes, but instead, to the target end-points.

Fabric configuration: It is contemplated that the polymorphic network fabric be configured via a bit stream. As opposed to FPGAs, which are programmed from external sources, when an application is loaded on a chip with this polymorphic fabric, the operating system (OS), or runtime system, can reconfigure the network accordingly, by writing to memory-mapped bits containing the configuration to the memory register comprising the switches used in the configurable data connections as would be done for any other I/O device. The polymorphic network could also include a default network configuration to support applications that do not specify a custom interconnect.

Examples of Polymorphism

The polymorphic network described above introduces several modes of flexibility into the network, including flexible topologies, data path widths, and queue depths, which are described in further detail below.

Flexible or hybrid topologies: Configuration of the polymorphic fabric to implement a particular topology is a matter of forming appropriately sized switches and connecting them according to the desired topology. FIG. 10 illustrates the mapping of a portion of a fat tree 200 onto the polymorphic fabric. It is a four-way fat tree with three levels, including leaf switches 202, each having a network input queue 204 and an output queue 206, a mid-level switch 208, and a root-level switch 210, and is the same topology used in the design space exploration discussed above. Conductive paths 212 and 214 interconnect these levels. For legibility, the sub tree of only one root node is shown. In a full mapping, the leftover routing resources on the north, south, and east edges of this diagram would be used to connect multiple nodes together. Note that in the regions occupied by this design, only six of the 128 queues have gone unused. This high utilization is enabled by the ability to form switches from slices assembled from multiple adjacent regions. A fat tree is demonstrated here because, with highly-connected, high-degree switches, it demands more careful configuration of the fabric. For an example of another topology, FIG. 12 shows a mapping of a small section of a mesh 230, illustrating the flexible packet sizing.

Flexible buffer allocation: It is possible to also increase the logical switch buffer size using this exemplary polymorphic network fabric. FIG. 11 illustrates this technique for a portion 220 of this exemplary polymorphic network. A single slice 222 can be configured to connect an input queue 224 to an output queue 226. Such a configuration forms a single logical buffer from two physically separate ones, in which packets advance from the back half to the front half automatically as necessary. Such a configuration could also be viewed as a 1×1 switch, which in fact does not route or switch, but simply advances packets forward as a queue would.

The decision to increase switch buffer resources need not be a universal decision. It is possible to selectively increase buffer resources on certain switches or ports as the application may demand. This capability dovetails nicely with other research that develops tools to identify the ideal network configuration for a particular application.

Flexible packet sizing: In a similar manner, it is also possible to increase the network packet size. Instead of aggregating sequential buffers, as in the previous example, parallel buffers and links can be aggregated. In effect, this aggregation increases the network's packet size and data path width. FIG. 12 illustrates this technique as applied to small 2×2 mesh 230, which aggregates parallel buffers throughout the network, for example, parallel buffers 232 and 234. Both of these aggregation techniques increase the per-switch, or per-link resource requirements of the fabric. However, with the polymorphic fabric, the increased resource demand is commensurate with the analogous increase in resource needs, in buffer sizes, and wire bit widths, of a classic ASIC interconnect. Note that the polymorphic network need not be restricted solely to general-purpose interconnect configurations. Instead, it can support nearly arbitrary application-by-application tailoring. The performance benefits of such customization are well-documented in the literature, but were previously unattainable on multi-application devices.

Polymorphic Fabric Design and Evaluation

The discussion above presented a general architecture for a polymorphic network; however, it left all of the design parameters, such as packet widths and queue capacities unspecified. FIG. 13 illustrates exemplary architectural parameters 240 that should be decided prior to implementing a polymorphic network. In this example, there are N slices 242 to a region, each slice containing a queue that is W bits wide and D entries deep, as shown in the inset detail view. Each region has two crossbars that are N×H where H, the number of horizontal crossbars, must be at least equal to N. The N dimension of a crossbar includes conductor pairs 166a and 166b, while the H dimension includes conductor pairs 168a and 168b. Similarly, each configurable link track intersection is V×H, wherein the V dimension also includes conductor pairs 166a and 166b. As with the original network design space, it is helpful to explore the parameter space of polymorphic fabrics. The first section of Table 4 (below) articulates the polymorphic network parameter range considered, which totals 108 polymorphic network instances.

Based on the parameters noted in Table 4 below, the area of the base element of the fabric can be calculated for an exemplary embodiment. The base element consists of a region and a crossbar and can be replicated in an array that forms a full fabric. The second section of Table 4 details how the area of the queues and crossbars are calculated and totaled to compute the area of a particular instance of the polymorphic fabric. In a region, there are N queues, and beneath them are disposed two crossbars. One crossbar extends from the input lines to the horizontal crossbars, which is N×H, and one crossbar extends from the horizontal lines to the output queues, which is H×N. Between regions is a second crossbar. It consists of four crossbars, two of size H×2V for packets entering in the horizontal direction, from the left or right, and two of size V×2H for packets entering in a vertical direction, from above or below.

The number of base elements needed to implement a particular network, as well as the resulting latency and throughput of the network, depend on how the polymorphic fabric is configured, which is where the last parameter, the network configuration C, comes into consideration. To determine how much polymorphic fabric a particular network configuration will require, it is necessary to calculate the number of queues each of its switches will require. This calculation can be performed manually for 2×2 switches, and up to 8×8 switches in each polymorphic fabric. These mappings account for the spatial blowup that occurs when the switch requires more bisectional bandwidth than is available horizontally in a single region. These initial queue counts were increased proportionally if the network configuration demanded deeper or wider queues than the queues provided by the polymorphic fabric. Note that in the reverse case, because queues in the polymorphic fabric cannot be subdivided, when the network configuration queues are smaller than those in the fabric, the extra queue capacity amounts to wasted area. Finally, for each network topology, there should be an accounting of any extra polymorphic fabric required to implement the overall routing.

TABLE 4

Polymorphic Fabric Design Space, Area Model, & Configuration Model

Polymorphic Network Fabric Design Space Parameters

| Description | Symbol | Range |
|---|---|---|
| Number of slices per region | N | 2, 4, 8, 16 |
| Queue width | W | 32, 64, 128 |

TABLE 4-continued

Polymorphic Fabric Design Space, Area Model, & Configuration Model

| | | |
|---|---|---|
| Queue depth | D | 4, 16, 64 |
| Width of horiz. configurable link tracks | H | N, 2 × N |
| Width of vert. configurable link tracks | V | N, 2 × N |
| Network configuration | C | each network |

Polymorphic Fabric Area Model

| Description | Symbol | Value |
|---|---|---|
| Queue area | $Queue_{area}$ | 0.00002 mm$^2$/bit |
| Synthesis | | |
| Wire pitch | X | 0.00024 mm |
| Crossbar area | $XBar_{area}(D_{in}, D_{out})$ | $X^2 \times D_{in} \times D_{out} \times W$ |
| Region area | $PolyRegion_{area}$ | $N \times W \times D \times Queue_{area} +$ $XBar_{area}(N, H) + XBar_{area}(H, N)$ |
| Analytical | | |
| Crossbar area | $PolyXBar_{area}$ | $2 \times XBar_{area}(H, 2 \times V) + 2 \times$ $XBar_{area}(V, 2 \times H)$ |
| Total area of base element | $BaseElement_{area}$ | $PolyRegion_{area} + PolyXBar_{area}$ |

Polymorphic Fabric Configuration Model

| Description | Symbol | Value |
|---|---|---|
| Base # of polymorphic queues | $PQueues_{base}$ | manual switch configuration |
| Queue depth adjustment | $Adjustment_{depth}$ | $\begin{cases} \frac{C_{QueueDepth}}{D} & \text{if } C_{QueueDepth} > D \\ 1 & \text{otherwise} \end{cases}$ |
| Queue width adjustment | $Adjustment_{width}$ | $\begin{cases} \frac{C_{QueueWidth}}{W} & \text{if } C_{QueueWidth} > W \\ 1 & \text{otherwise} \end{cases}$ |
| Adjusted number of polymorphic queues | $PQueueus_{adjusted}$ | $PQueues_{base} \times Adjustment_{depth} \times Adjustment_{width}$ |
| Number of base elements needed | $BaseElements_{needed}$ | $PQueues_{adjusted}/N$ |
| Area of polymorphic fabric to implement | $Fabric_{area}$ | $BaseElement_{needed} \times BaseElement_{area}$ |

Area Overhead of Polymorphic Network Designs

The polymorphic fabric designs can be compared based on the area overhead that each one incurs when configured with varying network designs. The configuration model outlined in Table 4 can be used to calculate the amount of each polymorphic fabric required to implement each of the pareto optimal designs from the initial network design space as discussed above. The data can be averaged across all pareto network designs. FIG. 14 illustrates a plot 250 of the average area expansion of each possible polymorphic fabric design across all of the pareto optimal network configurations. Each white bar in the graph corresponds to one polymorphic fabric design. The height of the bar represents the area of the polymorphic fabric relative to the ASIC area of the network it is implementing. There are several overriding trends that govern the quality of a polymorphic fabric, as follows.

The "worst" fabrics, those that incur the greatest increases in area consumption, are the fabrics, which over-provision the polymorphic fabric queues, both in depth and width, relative to the queues in the configuring network.

For a fixed queue size, the more constrained the horizontal routing resources, the greater the area over-head.

The number of slices per region and the amount of vertical routing do not influence area overhead with any notable pattern. The reason vertical routing resources are less significant than horizontal routing resources is because horizontal routing resources are used to build network switches and route horizontally, while vertical routes are used only for routing.

The "best" fabrics are highlighted in an expanded view (within a rectangle 252) on the left side of FIG. 14. In keeping with the overall trends, the best polymorphic designs implement narrow and shallow queues, with at least eight horizontal routing tracks. This approach minimizes waste, by allowing queue aggregation, in the manner described above, only when the configuration demands it. The most efficient polymorphic fabrics incur a 38% area overhead compared to the average of the pareto optimal ASIC network designs developed for the polymorphic network.

Area Overhead on Optimal Networks

The most efficient polymorphic fabric was identified as one with four slices per region, four 32-bit packets per queue, eight horizontal and four vertical routing tracks (N=4, D=4, W=32, H=8, V=4). The amount of this polymorphic fabric required to implement each pareto optimal network design was then examined. FIG. 15 displays a plot 260 of these results. Each pair of bars corresponds to a network design, the height of the black bars indicating its area when fabricated directly, and the height of the white bars indicating the amount of polymorphic fabric required to implement the same network. This graph illustrates the flexibility of the polymorphic fabric. Once the designer has committed to spending a certain amount of area on a polymorphic fabric (corresponding to some point on the vertical Y axis of FIG. 15), any network can be implemented for which the corresponding white bar does not exceed that area budget. This chart includes the pareto optimal designs from the initial design space exploration, however the network configurations need not be constrained to be one of them.

For the latency-bandwidth performance of all of the network configurations on all of the work-loads for only the networks that consume less than the original 33 mm$^2$ area budget, and after culling network designs that perform indistinguishably, 119 design points remain, only twelve of which are not realizable in a polymorphic network subject to the same 33 mm$^2$ area budget. Furthermore, based on their performance, no one would likely build these twelve design points, because better designs exist.

This result depends on the particular area budget chosen. FIG. 16 illustrates a plot 270 showing the polymorphic network coverage—the percentages of within-budget fixed-function networks implementable with the same within-budget polymorphic network (vertical axis)—as a function of the area budget (horizontal axis). The steep drop on the left side of this graph when the area budget is less than about 7% indicates that when area is very limited, it is preferable to implement a fixed-function network, because the flexibility of a polymorphic network is compromised. However, once 7% or more of the die area is allocated to the interconnect function, the polymorphic networks reach approximately 80% coverage of the fixed-function networks, meaning that a polymorphic network could implement 80% of the viable fixed-function designs. It should also be noted that a 15% area budget encompasses all pareto optimal fixed-network designs. At 25% of die area, this coverage reaches 92%, ultimately reaching 97% at 30%.

In effect, the data demonstrate that it is preferable to employ a polymorphic network rather than a static convention network, except when the application is fixed and well known ahead of time (e.g., embedded fixed-function devices); and if an area constraint tighter than 7% is required. Of the fixed topology networks that were studied, no configuration (queue size, packet size, etc.) exists that is under the chip wide 15% area budget and achieves a performance superior to a polymorphic network. For any pareto-optimal fixed configuration network with an area budget less than 15% of the chip area, a polymorphic network can be instantiated that is also less than 15% of chip area that achieves the same performance. Although this polymorphic network will be 38% larger than the fixed-function ASIC network, it is possible to capitalize on the adaptability of the polymorphic network and reconfigure at runtime to best match the application demands.

Although the concepts disclosed herein have been described in connection with the preferred form of practicing them and modifications thereto, those of ordinary skill in the art will understand that many other modifications can be made thereto within the scope of the claims that follow. Accordingly, it is not intended that the scope of these concepts in any way be limited by the above description, but instead be determined entirely by reference to the claims that follow.

The invention in which an exclusive right is claimed is defined by the following:

1. A customizable semiconductor chip, comprising:
   (a) at least one functional electronic component, each functional electronic component having a plurality of first connection ports used for input and output of electrical signals; and
   (b) a polymorphic network comprising a semiconductor substrate on which the at least one functional electronic component is bonded, the polymorphic network including a plurality of second connection ports that are electrically connected to the first connection ports, the polymorphic network including a plurality of signal conveyance resources for selectively interconnecting specific ones of the second connection ports to specific other ones of the second connection ports in a desired interconnection scheme wherein the desired interconnection scheme can be modified up to a time that an application that will use the desired interconnection scheme is run by the customizable semiconductor chip.

2. The customizable semiconductor chip of claim 1, wherein the polymorphic network comprises a plurality of regions that are interconnected by selectively configurable crossbars, each region including a plurality of selectively configurable slices.

3. The customizable semiconductor chip of claim 2, where each selectively configurable slice includes:
   (a) an input queue;
   (b) a router that determines a route for data;
   (c) broadcast conductors for the route;
   (d) configurable data connections; and
   (e) an arbiter that controls data flow.

4. The customizable semiconductor chip of claim 2, wherein the plurality of selectively configurable slices are disposed in clusters to form each of the plurality of regions, and wherein the plurality of slices are interconnected by double crossbars that enable redefinition of input connections and of output connections between the slices in accord with the desired interconnection scheme.

5. The customizable semiconductor chip of claim 4, wherein the double crossbars are segmentable, enabling slices on one or more regions to function together as a switch.

6. The customizable semiconductor chip of claim 3, wherein the router in a slice determines to which output connection a first packet in the input queue should be routed, and the arbiter grants access to an output connection for one packet at a time.

7. The customizable semiconductor chip of claim 6, wherein, using wormhole arbitration, a lead packet of a message includes information specifying a predefined route for the message through the polymorphic network, and wherein the routers and the arbiters in the slices respond to the information by establishing interconnections to achieve the predefined route for all subsequent packets belonging to the message.

8. The customizable semiconductor chip of claim 2, wherein the selectively configurable crossbars that are disposed between the regions comprise a plurality of switches that are selectively set in a state that achieves the desired interconnection scheme.

9. The customizable semiconductor chip of claim 1, wherein the polymorphic network includes memory registers into which configuration data defining the desired interconnection scheme within the polymorphic network are written, the configuration data being written to the memory registers at least by a time that an application that will use the desired interconnection scheme is loaded to run on the customizable semiconductor chip.

10. The customizable semiconductor chip of claim 9, further comprising a plurality of switches that access the configuration data stored in the memory registers to establish internal and external interconnections and functionality of the polymorphic network, so that by modifying the configuration data, a different desired interconnection scheme and functionality is achieved in the polymorphic network.

11. A method for applying a desired interconnection scheme to a polymorphic network of a customizable semiconductor chip to provide a desired functionality for the customizable semiconductor chip, wherein the customizable semiconductor chip includes at least one functional component that is coupled to the polymorphic network in a semiconductor die, comprising the steps of:
   (a) providing configuration data that define the desired interconnection scheme specifying interconnections between ports on the at least one functional component;
   (b) loading the configuration data into memory registers that define the state of configurable data interconnections within the polymorphic network to achieve the desired interconnection scheme; and
   (c) while running an application on the customizable semiconductor chip that will employ the desired interconnection scheme, applying the configuration data stored in the memory to selectively modify signal conveyance resources of the polymorphic network to achieve specific interconnections between the ports of the at least one functional component.

12. The method of claim 11, wherein the step of applying the configuration data comprises the step of automatically employing the configuration data to selectively reconfigure a plurality of crossbars interconnecting a plurality of regions comprising the polymorphic network.

13. The method of claim 12, wherein the step of applying the configuration data further comprises the step of automatically employing the configuration data to selectively configure interconnections between a plurality of slices comprising each of the plurality of regions.

14. The method of claim 13, wherein each slice comprises an input queue, a router that determines a route for data, broadcast conductors for the route, configurable data connections, and an arbiter that controls data flow, further comprising the steps of employing the router to determine to which output conductor of a slice a first packet of data in the input queue should be routed, and employing the arbiter to grant access to an output conductor for one packet of data at a time.

15. The method of claim 14, further comprising the step of using wormhole arbitration to employ information specifying a predefined route for a message through the polymorphic network, where the information is carried by a lead packet of the message, to control routers and arbiters in the polymorphic network, so as to establish interconnections within the polymorphic network for all subsequent packets belonging to the message.

16. The method of claim 13, further comprising the steps of interconnecting the plurality of slices with double crossbars, and enabling redefinition of input connections and output connections between slices with the double crossbars, in accord with the desired interconnection scheme.

17. The method of claim 16, wherein the double crossbars are segmentable, further comprising the step of configuring slices on one or more regions to function together as a switch.

18. The method of claim 11, further comprising the step of enabling the desired configuration data that are stored in the memory registers to be replaced with new desired configuration data, so that internal and external interconnections of the polymorphic network are redefined before an application is next run on the customizable semiconductor chip.

19. A polymorphic network that is configured to interconnect ports and to enable redefining interconnections between the ports of one or more functional components, comprising:
   (a) a customizable semiconductor chip substrate that includes a plurality of ports adapted to electrically connect to corresponding ports on one or more functional components and including input connections adapted for coupling the customizable semiconductor chip substrate into an external circuit;
   (b) a plurality of configurable data connections that can be selectively set to open or close conductive paths between and through specific electrical conductors in the polymorphic network to customize interconnections between the ports on the one or more functional components; and
   (c) memory registers in which are stored connection data defining states of the configurable data connections to achieve a desired interconnection scheme for electrically interconnecting the plurality of ports of the polymorphic network, the states of the configurable data connections being modifiable at any time until an application that will use the polymorphic network is run.

20. The polymorphic network of claim 19, further comprising a plurality of regions that are interconnected by crossbars in an interconnection layout that is specified by the connection data stored in the memory registers, each region including a plurality of slices that are also interconnected as specified by the connection data, and each slice including an arbiter and a router for controlling data flow in the slice.

21. The polymorphic network of claim 19, wherein the configurable data connections comprise a plurality of switches in the polymorphic network that are selectively set in response to the connection data to achieve the desired interconnection scheme.

22. The polymorphic network of claim 19, wherein the ports are configured to be electrically coupled to one or more functional components that comprise one or more separate discrete electronic components using a flip-chip technique so that the polymorphic network supports the one or more electronic components and wherein the semiconductor substrate is intended to be used with a plurality of different applications that differ at least in part by the interconnections provided by the polymorphic network, using specific desired interconnection schemes.

23. The polymorphic network of claim 19, wherein the polymorphic network functions as an on-chip network, for interconnecting one or more functional components that are included in a semiconductor die on which the polymorphic network is formed, by bit mapping the connection data to the plurality of configurable data connections, the connection data determining an open state or a closed state of each of the plurality of configurable data connections.

24. The polymorphic network of claim 19, wherein the semiconductor substrate includes conductors that distribute electrical power to energize one or more functional components, and routes any required clocking signals to the one or more functional components.

25. The polymorphic network of claim 19, wherein wormhole arbitration is used to define a path for packets of each message conveyed by the polymorphic network, and wherein a lead packet of the message includes information that specifies a route for routing subsequent packets of the message between ports.

26. A customizable semiconductor chip, comprising:
   (a) at least one functional electronic component, each functional electronic component having a plurality of first connection ports used for input and output of electrical signals; and
   (b) a polymorphic network comprising:

(i) a semiconductor substrate on which the at least one functional electronic component is bonded;

(ii) a plurality of second connection ports that are electrically connected to the first connection ports;

(iii) a plurality of signal conveyance resources for selectively interconnecting specific ones of the second connection ports to specific other ones of the second connection ports in a desired interconnection scheme wherein the desired interconnection scheme can be modified up to a time that an application that will use the desired interconnection scheme is run by the customizable semiconductor chip; and (iv) a plurality of regions that are interconnected by selectively configurable crossbars, each region including a plurality of selectively configurable slices, wherein each selectively configurable slice includes:

(1) an input queue;

(2) a router that determines a route for data;

(3) broadcast conductors for the route;

(4) configurable data connections; and (5) an arbiter that controls data flow.

27. A method for applying a desired interconnection scheme to a polymorphic network of a customizable semiconductor chip to provide a desired functionality for the customizable semiconductor chip, wherein the customizable semiconductor chip includes at least one functional component that is coupled to the polymorphic network in a semiconductor die, comprising the steps of:

(a) providing configuration data that define the desired interconnection scheme specifying interconnections between ports on the at least one functional component;

(b) loading the configuration data into memory registers that define the state of configurable data interconnections within the polymorphic network to achieve the desired interconnection scheme; and (c) while running an application on the customizable semiconductor chip that will employ the desired interconnection scheme, automatically applying the configuration data stored in the memory to selectively modify signal conveyance resources of the polymorphic network to achieve specific interconnections between the ports of the at least one functional component, including the steps of:

(i) selectively reconfiguring a plurality of crossbars interconnecting a plurality of regions comprising the polymorphic network; and (ii) selectively configuring interconnections between a plurality of slices comprising each of the plurality of regions, by interconnecting the plurality of slices with double crossbars, and enabling redefinition of input connections and output connections between slices with the double crossbars, in accord with the desired interconnection scheme.

28. A polymorphic network that is configured to interconnect ports and to enable redefining interconnections between the ports of one or more functional components, comprising:

(a) a customizable semiconductor chip substrate that includes a plurality of ports adapted to electrically connect to corresponding ports on one or more functional components and including input connections adapted for coupling the customizable semiconductor chip substrate into an external circuit, wherein said customizable semiconductor chip substrate includes conductors that distribute electrical power to energize one or more functional components, and routes any required clocking signals to the one or more functional components;

(b) a plurality of configurable data connections that can be selectively set to open or close conductive paths between and through specific electrical conductors in the polymorphic network; and (c) memory registers in which are stored connection data defining states of the configurable data connections to achieve a desired interconnection scheme for electrically interconnecting the plurality of ports of the polymorphic network, the states of the configurable data connections being modifiable at any time until an application that will use the polymorphic network is run.

* * * * *